United States Patent
Matsumura et al.

(10) Patent No.: US 7,585,703 B2
(45) Date of Patent: Sep. 8, 2009

(54) PIXEL CONTROL ELEMENT SELECTION TRANSFER METHOD, PIXEL CONTROL DEVICE MOUNTING DEVICE USED FOR PIXEL CONTROL ELEMENT SELECTION TRANSFER METHOD, WIRING FORMATION METHOD AFTER PIXEL CONTROL ELEMENT TRANSFER, AND PLANAR DISPLAY SUBSTRATE

(75) Inventors: Hideki Matsumura, Kanazawa (JP); Kenichiro Kida, Matto (JP); Shigehira Minami, Kanazawa (JP)

(73) Assignee: Ishikawa Seisakusho, Ltd., Kanazawa-Shi, Ishikawa (JP)

( * ) Notice: Subject to any disclaimer, the term of this patent is extended or adjusted under 35 U.S.C. 154(b) by 798 days.

(21) Appl. No.: 10/535,182

(22) PCT Filed: Nov. 19, 2003

(86) PCT No.: PCT/JP03/14702
§ 371 (c)(1),
(2), (4) Date: May 17, 2005

(87) PCT Pub. No.: WO2004/047057
PCT Pub. Date: Jun. 3, 2004

(65) Prior Publication Data
US 2006/0055864 A1 Mar. 16, 2006

(30) Foreign Application Priority Data
Nov. 19, 2002 (JP) ............................. 2002-334604
Feb. 12, 2003 (JP) ............................. 2003-033289
Jul. 14, 2003 (JP) ............................. 2003-196610
Aug. 26, 2003 (JP) ............................. 2003-301478

(51) Int. Cl.
*H01L 21/82* (2006.01)

(52) U.S. Cl. ............................... 438/128; 257/E27.132
(58) Field of Classification Search .......... 257/E27.132; 349/187; 438/128
See application file for complete search history.

(56) References Cited

U.S. PATENT DOCUMENTS 5,206,749 A * 4/1993 Zavracky et al. ............... 349/45
5,258,320 A * 11/1993 Zavracky et al. ............... 438/27
5,438,241 A * 8/1995 Zavracky et al. ........... 315/169.3

(Continued)

FOREIGN PATENT DOCUMENTS

JP    H04-056827 A    2/1992

(Continued)

*Primary Examiner*—David Vu
*Assistant Examiner*—Earl N Taylor
(74) *Attorney, Agent, or Firm*—Manabu Kanesaka

(57) ABSTRACT

There is provided a method for selectively transferring pixel control devices onto a planar display substrate, which method enables prepared pixel control devices to be easily, reliably and inexpensively mounted without inducing any loss of pixel control devices. The pixel control devices (1) are formed in a large number at pitches (5, 6) obtained respectively by dividing pitches (105, 106) on the planar display substrate (100) by natural numbers. The pixel control devices corresponding to the number of the pitches (105, 106) on the planar display substrate (100) are picked up, retained on a transparent thermoplastic resin film (101) formed on the planar display substrate (100) utilizing the plastic deformation of the film and fixed at the peripheries thereof with a transparent ultraviolet curing resin film (104).

4 Claims, 19 Drawing Sheets

U.S. PATENT DOCUMENTS

| | | | |
|---|---|---|---|
| 6,656,819 B1* | 12/2003 | Sugino et al. | 438/460 |
| 6,683,418 B2* | 1/2004 | Shoji et al. | 315/224 |
| 2002/0096994 A1* | 7/2002 | Iwafuchi et al. | 313/495 |
| 2002/0115265 A1* | 8/2002 | Iwafuchi et al. | 438/458 |
| 2002/0168579 A1* | 11/2002 | Suzuki et al. | 430/7 |
| 2002/0171089 A1* | 11/2002 | Okuyama et al. | 257/88 |
| 2003/0011377 A1* | 1/2003 | Oohata et al. | 324/512 |
| 2003/0034120 A1* | 2/2003 | Yanagisawa et al. | 156/238 |
| 2003/0087476 A1* | 5/2003 | Oohata et al. | 438/108 |
| 2003/0160258 A1* | 8/2003 | Oohata | 257/99 |
| 2003/0162463 A1* | 8/2003 | Hayashi et al. | 445/24 |
| 2003/0170971 A1* | 9/2003 | Tomoda et al. | 438/602 |
| 2004/0080032 A1* | 4/2004 | Kimura et al. | 257/678 |

FOREIGN PATENT DOCUMENTS

| | | |
|---|---|---|
| JP | H05-224234 A | 9/1993 |
| JP | H06-148677 | 5/1994 |
| JP | H06-202145 A | 7/1994 |
| JP | H06-265932 A | 9/1994 |
| JP | H10-222097 A | 8/1998 |
| JP | 2001-7340 A | 1/2001 |
| JP | 2001-133745 A | 5/2001 |
| JP | 2001-332680 A | 11/2001 |
| JP | 2002-158237 A | 5/2002 |
| JP | 2002-1582387 A | 5/2002 |
| JP | 2002-244576 A | 8/2002 |

\* cited by examiner

Ultraviolet rays

Prior Art
Fig35(a) First transfer
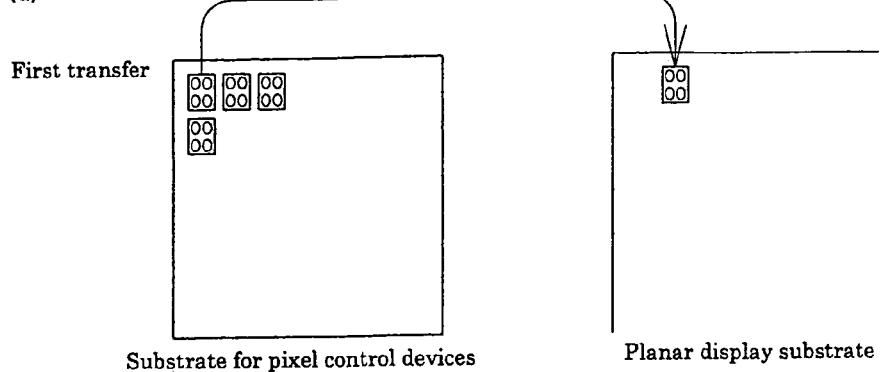
Second transfer
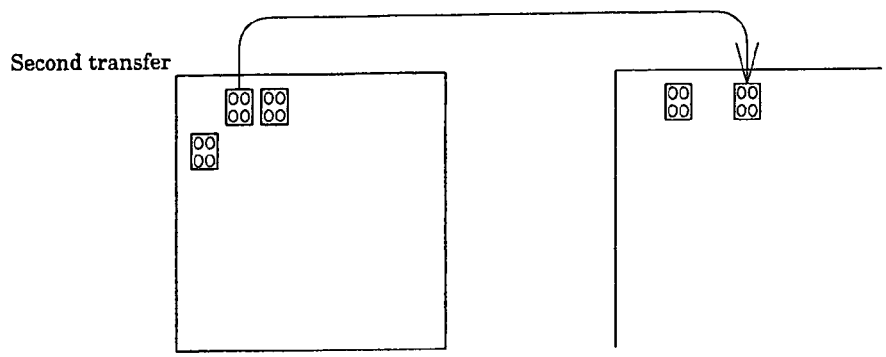
Fig35(b) First transfer
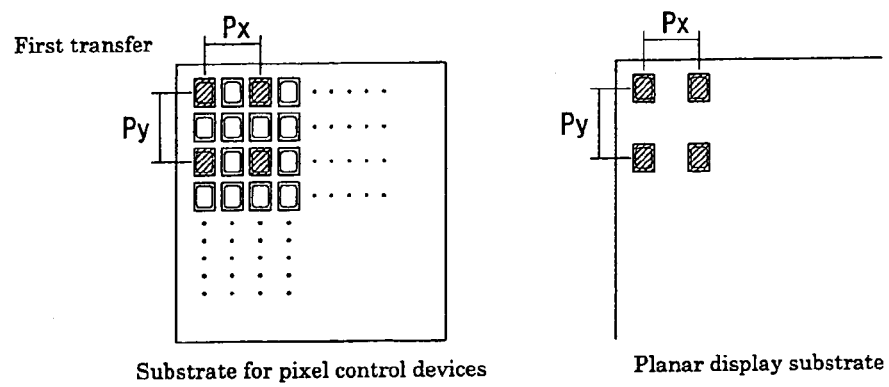
Second transfer
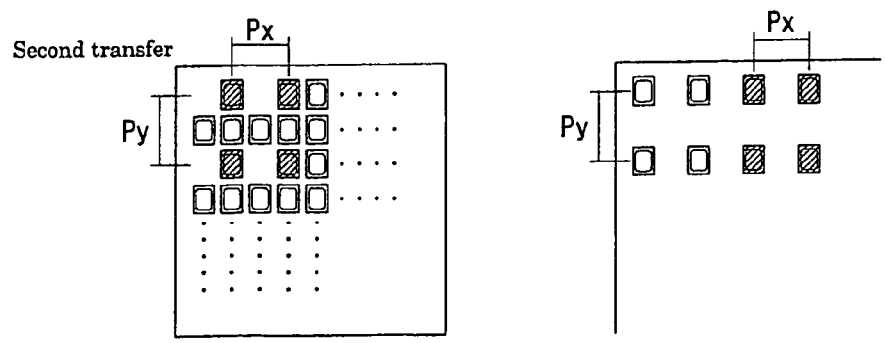

Case where transfer origin and transfer destination correspond to each other at 1:1

Transfer of pixel control devices in present invention

Pixel electrode | pixel control device | wiring

Pixel (or pixel electrode 3) | Pixel control device (Transistor device 12)

PIXEL CONTROL ELEMENT SELECTION TRANSFER METHOD, PIXEL CONTROL DEVICE MOUNTING DEVICE USED FOR PIXEL CONTROL ELEMENT SELECTION TRANSFER METHOD, WIRING FORMATION METHOD AFTER PIXEL CONTROL ELEMENT TRANSFER, AND PLANAR DISPLAY SUBSTRATE

RELATED APPLICATIONS

The present application is based on International Application No. PCT/JP2003/014702 filed Nov. 19, 2003, and claims priority from, Japanese Application Numbers 2002-334604, 2003-33289, 2003-196610 & 2003-301478, filed Nov. 19, 2002, Feb. 12, Jul. 14 and Aug. 26, 2003, respectively, the disclosures of which are hereby incorporated by reference herein in its entirety.

TECHNICAL FIELD

The present invention relates to a method for selectively transferring a pixel control device from the substrate of a planar display, such as liquid crystal displays, organic EL displays, etc., on which a plurality of pixel control devices, such as thin film transistors etc., have preliminarily been formed; to a wiring formation method performed after the transfer of the pixel control device; to a pixel control device mounting apparatus used in the pixel control device selection transfer method; and to a planar display substrate. It particularly relates to a pixel control device selection transfer method used when the pixel control device is the one that controls a plurality of pixels; to a pixel control device mounting apparatus used in the method; to a wiring formation method performed after the transfer of the pixel control device; and to a planar display substrate.

BACKGROUND ART

In the displays represented by liquid crystal displays and organic EL displays, insulation films, semiconductor films, etc. are successively deposited on a glass substrate (also called a first substrate or an array substrate) through the chemical vapor deposition (CVD) or the like method and subjected to the same steps as fabricating semiconductor integrated circuits, and then a microelectronic device, such as a thin film transistor (TFT) etc., is formed in the vicinity of each of pixels constituting a display screen. By controlling on-off operation and light and shade of each pixel with this microelectronic device, a display image is constituted. That is to say, in fact, the active devices, such as TFTs etc. are fabricated directly on the glass substrate used, in fact, for a planar display. However, it is intended to enlarge the display area to reply to a recent demand for display screen enlargement, the following problems have been raised.

The first problem is that the fabrication device, such as CVD device etc. for fabricating microelectronic devices on a planar display substrate, has to be inevitably enlarged with the enlargement of a planar display. In addition, since many steps are required for fabricating the microelectronic device, a plurality of the aforementioned enlarged fabrication devices are required and a clean room for installing these fabrication devices has to be enlarged. As a result, it is difficult to reduce the fabrication cost.

The second problem is that since an amorphous silicon (a-Si) film etc. that can be fabricated from a thin film that can be deposited at low temperature of around 300° C. the glass substrate can endure is used as a semiconductor film, the operation performance is inferior to that of semiconductor electronic devices using crystallized silicon. To solve the inferior operation performance, studies have been made on the fabrication of a TFT enhanced in mobility and consequently enhanced in operation performance through the steps of melting the deposited a-Si to form polysilicon (poly-Si) film and using the poly-Si film. Particularly in the display according to an organic EL that emits light by application of individually controlled electric currents through the respective pixels, it is generally confirmed that the operation performance of the a-Si TFT is insufficient. In view of this, expectation of a laser-melted poly-Si film is heightened. However, since it highly costs to fabricate a laser-melted poly-Si film, it is premised that the application thereof is only in a restricted range. Also in an a-Si TFT that has a display screen diagonal dimension of 40 inches or more, an a-Si film deposition step and the following pattern transfer step are difficult to take, and the cost for taking the steps becomes increased.

The third problem is that in displays using a glass plate as a substrate, when the display screen size is in the range of 40 to 100 inches, the thickness of the glass substrate has to be large enough to attain its sufficient strength. This increases the entire display device weight and consequently requires a device structure to be enlarged in order to stably install the display device and raises the entire cost.

The technique of fabricating a plurality of microelectronic devices, such as TFT etc., in advance on a substrate other than a glass substrate and mounting the fabricated microelectronic devices at a predetermined position on a glass substrate is disclosed. (Refer to Non-patent Document 1 and Patent Documents 1 and 2, for example.)

Non-patent Document 1: "Application of Fluidic Self Assembly ™ Technology to Flat Panel Displays" edited by Anne Chiang, IDW 2000 Letters, ITE, published by SID, Nov. 29, 2000, pp. 195-198

Patent Document 1: JP-A HEI 11-142878

Patent Document 2: JP-A 2002-244576

Non-patent Document 1 discloses a method of preparing a mold for fitting pixel control devices (microelectronic devices) onto a flat panel display substrate and mounting a great number of pixel control devices prepared in advance at a different place onto the mold by pouring them together with a liquid. However, since the ratio of the number of the pixel control devices successfully fitted into the mold on the display substrate to the number of the pixel control devices poured together with the liquid is small, the prior art method is not put to practical use. Furthermore, since a great number of pixel control devices are poured onto the display substrate in view of the small ratio, excess pixel control devices not fitted into the mold have to be recovered. Moreover, since the pixel control devices when being poured together with the liquid and recovering the excess pixel control devices move directly in contact with the display substrate, there is a fair possibility of the pixel control devices damaging the display substrate.

On the other hand, in Patent Document 1, disclosed is a method of forming pixel control devices on a silicon substrate in relation to the pitch of array on a planar display substrate, forming recesses for fitting the pixel control devices (microelectronic devices) therein at positions of the display substrate to which the selected devices are transferred, position-aligning the devices on the silicon substrate relative to the display substrate and irradiating the devices with ultraviolet rays, thereby selectively weakening the adhering force between the pixel control devices to be transferred and the display substrate by an adhesive to fit the pixel control devices into the recesses in the display substrate. This prior art also discloses a method of forming an adhesive layer in each of the recesses and fixing the pixel control devices in the recesses.

To fit the pixel control devices in the recesses, it is necessary to form the recesses slightly larger than the pixel control devices. This size difference causes displacement of the pixel control devices in the recesses, resulting in making the subsequent wiring step difficult to conduct. When the size difference is made small to prevent the disadvantage from occurring, there is a possibility of slight positional displacement causing the pixel control devices to be fitted in the recesses in an inclined fashion. Therefore, formation of the recesses and positioning of the pixel control devices have to be conducted with extremely high precision. This is not realistic. In addition, in the case of fixing the pixel control devices in the recesses with adhesive layers formed therein, if the adhesive layers should ooze when adhering the pixel control devices adhere fast to the adhesive layers, there would be a possibility of the adjacent pixel control devices being adhered to the oozed adhesive layers. To avoid this, an extremely small amount of the adhesive has to be applied to extremely accurate positions, resulting in much higher cost.

As described above, Non-patent Document 1 has a problem in low ratio of success in disposing the pixel control devices on the display substrate and requires the excess pixel control devices not disposed to be removed and recovered, resulting in a method not capable of reducing the fabrication cost. Furthermore, the removal and recovering of the excess pixel control devices possibly damage the display substrate.

On the other hand, in the technique of Patent Document 1, there is a possibility of the pixel control devices being displaced in the recesses or being fitted aslant in the recesses due to the size difference between the pixel control devices and the recesses. To avoid this, positioning has to be performed with extremely high accuracy and, as occasion demands, it will be necessary to confirm the state of displacement one by one. Thus, the cost reduction cannot be attained. Furthermore, in the case of forming adhesive layers in the recesses, to prevent the adhesive layers from oozing, the amount and position of application of the adhesive layers has to be controlled with high accuracy. This is also a cause of high cost. Furthermore, in order to selectively weaken the adhesion force between the pixel control devices to be transferred and the display substrate by the adhesive layer through irradiation with ultraviolet rays, since it is difficult to irradiate the ultraviolet beams in the same shape as the pixel control devices, it can be assumed that the ultraviolet beams having a diameter larger than the shape of the pixel control device are irradiated onto the devices. In this case, the adhesion force by the adhesive layer will become weak gradually from around non-selected pixel control devices adjacent to the selected pixel control devices. In particular, the adhesion force to pixel control devices delay in the order selected is made weak before being selected. This causes positional disturbance of the non-elected pixel control devices to produce positional deviation and falling of the devices. In Patent Document 1, since the pixel control devices are irradiated with ultraviolet rays in the state, with all the pixel control devices upside down, there is a fair possibility of the devices falling off. This is a serious problem.

In the pixel control devices for controlling a plurality of pixels, it has been desired to efficiently wire these devices even after mounting the devices on the planar display substrate. However, the conventional wiring method comprises the steps of depositing wiring material on the entire surface of a substrate in the form of a thin film, pattern-transferring the deposited film using the photolithography method, etching the thin wiring material film and removing a resist film. These steps have incurred highly expensive and been complicated ones.

Furthermore, in almost all liquid crystal displays displaying an active matrix, one pixel (pixel electrode) and one pixel control device (TFT) are generally disposed at each intersection of longitudinal and lateral wirings (the longitudinal wiring being a source wiring and the lateral wiring being a gate wiring), and the TFT serves as a switching device for controlling a single pixel. Since the wiring portion in the display functions as a light-blocking portion, when there are plural wiring portions, there are limitations on enhancement of the aperture ratio. In Patent Document 2, as shown in FIG. 38, at the center of four pixels arranged in such a manner that two upper ones and two lower ones are across a lateral wiring and that two left ones and two right ones are across a longitudinal wiring, four thin film transistor devices 12 are densely disposed for controlling the four pixels. It seems to the inventors that the four thin film transistor devices 12 constitute an aggregation of devices for controlling the pixels on the peripheries of the devices, respectively. (The aggregation is called "a device block 13" in Patent Document 2.) However, in view of the aspect of the wirings used in common with each other while the pixel control devices are concentrated at the center of the four pixels, it is only conceived that a pixel control device controls a pixel adjacent thereto. Furthermore, in the method of Patent Document 2, since the devices are disposed at a two-pixel pitch, a light-shielding portion that constitutes a wiring portion exists at a two-pixel pitch. In this case, since colors are separate every two colors, such as RG, BR, GB or RG, the color phenomena are problematic. It is desirable to separate colors every three colors of RGB. In Patent Document 2, however, there gives rise to a color mixture with the color of the adjacent pixel that adversely affects a color contrast.

In view of the foregoing, an object of the present invention is to provide a pixel control device selection transfer method for selectively transferring pixel control devices for controlling a plurality of pixels precisely onto a planar display, such as a liquid crystal display, an organic EL display, etc. with ease at low cost without inducing any positional deviation, provide a mounting apparatus for mounting the pixel control devices used in the pixel control device selection transfer method, provide a wiring formation method performed after the transfer of the pixel control devices for efficiently wiring the pixel control devices at low cost and provide a planar display substrate that can realize reduction of the number of the wirings (wiring number reduction capability), makes it possible to reduce the area of light-blocking portions resulting from the wiring formation and excels in color phenomena and color contrast.

DISCLOSURE OF THE INVENTION

A first aspect of the invention provides a method for selectively transferring onto a planar display substrate pixel control devices each controlling a plurality of pixels, comprising the steps of fixing onto a support substrate a substrate for pixel control devices each having a surface thereof provided with a plurality of integrated circuits, each of which controls a plurality of pixels, fixing onto a substrate for pickup the pixel control devices on the substrate for pixel control devices that have been cut into individual integrated circuit, and causing the pixel control devices on the substrate for pickup to be chucked and retained onto a pickup device and transferring onto the planar display substrate the pixel control devices chucked and retained on the pickup device, wherein a plurality of pixel control devices are formed on the substrate for pixel control devices at a first direction array pitch px/m that is obtained by dividing an array pitch px in a first direction on the planar display substrate by a natural number m and at a second direction array pitch py/n obtained by dividing an array pitch py in a second direction on the planar display substrate that is orthogonal to the first direction by a natural number n and wherein a number of the pixel control devices only corresponding to the array pitches px and py of the planar display substrate are selectively chucked and retained on the pickup device from the pixel control devices fixed onto the substrate for pickup and then transferred onto the planar display substrate.

A second aspect of the invention provides a method for selectively transferring onto a planar display substrate pixel control devices each controlling a plurality of pixels with an integrated circuit, comprising the steps of fixing onto a support substrate a substrate for pixel control devices having a surface thereof provided with a plurality of integrated circuits each controlling a plurality of pixels, fixing onto a substrate for pickup the pixel control devices on the substrate for pixel control devices that has been cut into individual integrated circuit and causing the pixel control devices on the substrate for pickup to be chucked and retained onto a pickup device and transferring onto the planar display substrate the pixel control devices chucked and retained on the pickup device, wherein a plurality of pixel control devices are formed on the substrate for pixel control devices at a first direction array pitch px/m that is obtained by dividing an array pitch px in a first direction on the planar display substrate by a natural number m and at a second direction array pitch py/n obtained by dividing an array pitch py in a second direction on the planar display substrate that is orthogonal to the first direction by a natural number n, wherein the pickup device has vacuum chuckholes formed therein at an array pitch px in a direction corresponding to the first direction and an array pitch py in a direction corresponding to the second direction for chucking the pixel control devices, and wherein a number of the pixel control devices only corresponding to the array pitches px and py of the planar display substrate are selectively chucked and retained on the pickup device from the pixel control devices fixed onto the substrate for pickup and then transferred onto the planar display substrate. A third aspect of the invention provides a method for selectively transferring onto a planar display substrate pixel control devices each controlling a plurality of pixels with a integrated circuit, comprising the steps of fixing onto a support substrate a substrate for pixel control devices having a surface thereof provided with a plurality of integrated circuits each controlling a plurality of pixels, fixing onto a substrate for pickup the pixel control devices on the substrate for pixel control devices that has been cut into individual integrated circuit, and causing the pixel control devices on the substrate for pickup to be chucked and retained onto a pickup device and transferring onto the planar display substrate the pixel control devices chucked and retained on the pickup device, wherein a plurality of pixel control devices are formed on the substrate for pixel control devices at a first direction array pitch px/m that is obtained by dividing an array pitch px in a first direction on the planar display substrate by a natural number m and at a second direction array pitch py/n obtained by dividing an array pitch py in a second direction on the planar display substrate that is orthogonal to the first direction by a natural number n, wherein a mounting device comprising a pixel control device stage for disposing thereon the substrate for pickup and provided with a rotation angle adjustment mechanism, a substrate stage for disposing thereon the planar display substrate and provided with a rotation angle adjustment mechanism, a pickup device provided with a vacuum chuck that has vacuum chuckholes formed therein at an array pitch px in a direction corresponding to the first direction and an array pitch py in a direction corresponding to the second direction for chucking the pixel control devices and X-axis, Y-axis and Z-axis regulating mechanisms is used to selectively chuck and retain a number of the pixel control devices only corresponding to the array pitches px and py of the planar display substrate on the pickup device from the pixel control devices fixed onto the substrate for pickup and then transfer the chucked and retained pixel control devices onto the planar display substrate. In a fourth aspect of the invention having as a premise the method according to any one of the first to third aspects, each of the pixel control devices controls 3 colors×4 pixels arrayed in 2 columns and 6 rows with an integrated circuit and transferred to a center of the pixels arrayed in 2 columns and 6 rows.

In any one of the first to fourth aspects of the invention, since pixel control devices are formed on a support substrate at an array pitch px/m obtained by dividing an array pitch px of the pixel control devices in a first direction on a planar display substrate by a natural number m and an array pitch py/n obtained by dividing an array pitch py of the pixel control devices in a second direction orthogonal to the first direction on the planar display substrate by a natural number m, the pixel control devices are selectively transferred onto the planar display substrate every natural number m (at m−1 intervals) in the first direction and every natural number n (at n−1 intervals) in the second direction in accordance with the array pitches px and py. According to the present invention, since a pickup device is used to attain the transfer, the selected pixel control devices are only chucked and retained on the pickup device. Therefore, accidental disturbance of the array of the non-selected pixel control devices as in Patent Document 1 can be prevented.

A fifth aspect of the invention having as a premise the method according to any one of the first to third aspects provides a method for selectively transferring onto a planar display substrate pixel control devices each controlling a plurality of pixels with a integrated circuit, wherein the substrate for pixel control devices is attached to the support substrate, with the surface of the substrate for pixel control devices provided with the plurality of integrated circuits directed downward toward the support substrate, in the step of fixing onto the support substrate the substrate for pixel control devices having the surface thereof provided with the plurality of integrated circuits and, in the step of fixing onto the substrate for pickup the pixel control devices on the substrate for pixel control devices that has been cut into individual integrated circuit, the pixel control devices are transferred onto a surface of the substrate for pickup, with the substrate for pixel control devices upside down, and the substrate for pixel control devices is cut into individual integrated circuit after the surface of the substrate for pickup is directed upward.

According to this aspect of the invention, since the integrated circuits are transferred from the substrate for pixel control devices onto the substrate for pickup so that the surfaces of the integrated circuits may be directed upward and the pixel control devices are then formed, in the cutting step of cutting the substrate for pixel control devices to a predetermined size, the integrated circuits are discernible from the front surfaces thereof. Also in this aspect of the invention, since the pixel control devices are chucked and retained on the pickup device, with the array pitches px and py maintained similarly to the first aspect thereof, transfer can be attained without disturbing the array of the non-selected pixel control devices.

A sixth aspect of the invention having as a premise the method according to any one of the first to fourth aspects provides a method for selectively transferring onto a planar display substrate pixel control devices each controlling a plurality of pixels with a integrated circuit according to any one of the first to the third aspects, wherein the substrate for pixel control devices is attached to the support substrate, with the surface of the substrate for pixel control devices provided with the plurality of integrated circuits directed downward toward the support substrate, in the step of fixing onto the support substrate the substrate for pixel control devices having the surface thereof provided with the plurality of integrated circuits and, in the step of fixing onto the substrate for pickup the pixel control devices on the substrate for pixel control devices that has been cut into individual integrated circuit, the pixel control devices are transferred onto a surface of the substrate for pickup, with the substrate for pixel control devices upside down, after the substrate for pixel control devices is cut into individual integrated circuit, with the surface thereof directed downward toward the support substrate.

According to this aspect of the invention, since the pixel control devices are formed, with the integrated circuits directed toward the support substrate, in the mechanical polishing step of giving a predetermined thickness to the substrate for pixel control devices or in the cutting step of cutting the substrate to a predetermined size, it is made possible to prevent cut chips, etc from being attached to the integrated circuits.

In any one of the first to six aspects of the invention, it is desirable that the adhesive force between the support substrate and the substrate for pixel control devices in the step of fixing onto the support substrate the substrate for pixel control devices having the plurality of integrated circuits formed thereon be different from the adhesive force between the substrate for pickup and the substrate for pixel control devices in the step of fixing onto the substrate for pickup the pixel control devices on the substrate for pixel control devices cut into individual integrated circuit.

Thus, the adhesive force between the support substrate and the substrate for pixel control devices and that between the substrate for pickup and the substrate for pixel control devices are optionally set different from each other. This can cope with the case where the retaining force required at the step took on the support substrate differs from that required at the step took after the transfer onto the substrate for pickup.

According to any one of the first to sixth aspects of the invention, it is desirable that the adhesive means between the support substrate and the substrate for pixel control devices in the step of fixing onto the support substrate the substrate for pixel control devices having the plurality of integrated circuits formed thereon be different from that between the substrate for pickup and the substrate for pixel control devices in the step of fixing onto the substrate for pickup the pixel control devices on the substrate for pixel control devices cut into individual integrated circuit.

Thus, the adhesive means between the support substrate and the substrate for pixel control devices and that between the substrate for pickup and the substrate for pixel control devices are optionally set different. For example, as the adhesive means between the support substrate and the pixel control devices or substrate for pixel control devices, a sheet having an adhesive force variable by means of ultraviolet rays is used, and a sheet having an adhesive force variable by means of heat is used as the adhesive means between the substrate for pick up and the pixel control devices or substrate for pixel control devices.

According to any one of the first to sixth aspects of the invention, it is preferable that a transparent thermoplastic resin film is formed on the surface of the planar display substrate and, that in the step of selectively chucking and retaining the pixel control devices on the substrate for pickup onto the pickup device and transferring the retained devices onto the planar display substrate, a fluorine resin is applied in advance to the surface of the pickup device chucking the pixel control devices and that the pixel control devices are retained utilizing the plastic deformation of the transparent thermoplastic resin film.

Thus, the pixel control devices are retained by means of the plastic deformation of the transparent thermoplastic resin film formed on the planar display substrate. The transparent thermoplastic resin film that has been plastically deformable comes into intimate contact with the bottom and side surfaces of the pixel control devices to obtain the friction force effect over a wider range of area than in the case of the contact with the bottom surface alone, thereby enabling the pixel control devices to be firmly retained. Furthermore, since the surface of the pickup device that chucks the pixel control devices is coated in advance with a fluorine resin, the pickup device does not come into intimate contact with the transparent thermoplastic resin film. Thus, it is made possible to prevent the surface of the transparent thermoplastic resin film and the surfaces of the pixel control devices from being dirtied and also prevent accidental disturbance of the array of the pixel control devices arrayed.

When the pixel control devices chucked on the pickup device come into contact with the transparent thermoplastic resin film, the pixel control devices are disposed on the transparent thermoplastic resin film, with compressed air applied toward the resin film from the pickup device. It is desirable that the pixel control devices thus disposed in position be retained by means of plastic deformation of the transparent thermoplastic resin film that is induced by pressing. It is also desirable that the transparent thermoplastic resin be formed through the laminating processing of the planar display substrate using a transparent thermoplastic polymer film.

Thus, when the pixel control devices chucked on the pickup device come into contact with the transparent thermoplastic resin film, the pixel control devices are disposed on the transparent thermoplastic resin film, with compressed air applied toward the resin film from the pickup device. That is to say, since the pixel control devices are disposed as compressed by means of compressed air from the pickup device on the transparent thermoplastic resin film, the pixel control devices are firmly attached to transparent thermoplastic resin film. The pixel control devices thus disposed on the transparent thermoplastic resin are subjected to pressing. This pressing is performed by the use of a press after heating the transparent thermoplastic resin film or by the use of a heated press. The pressing timing may be either after the pixel control devices are all disposed or after an optional number of pixel-control devices are disposed. In the former timing, pressing is performed against the planar display substrate as a whole. The formation of the transparent thermoplastic resin film through the laminating processing of the planar display substrate is further desirable from the standpoint of the formation of a flat film.

According to any one of the first to sixth aspects of the invention, it is desirable that after chucking and retaining the pixel control devices on the planar display substrate, a transparent ultraviolet curing resin film be formed on the surfaces of the pixel control devices and planar display substrate and that after irradiating the side of the planar display substrate not retaining the pixel control devices with ultraviolet rays to selectively cure the transparent ultraviolet curing resin film, the cured transparent ultraviolet curing resin film on the pixel control devices be removed, thereby selectively transferring the pixel control devices onto the planar display substrate.

Thus, the transparent ultraviolet curing resin film is formed to cover the surfaces of the pixel control devices and the surface of the planar display substrate after the planar display substrate retains thereon the pixel control devices, and ultraviolet rays are then irradiated from the back surface side of the planar display substrate. Since the planar display substrate transparent in general transmits ultrasonic rays, the transparent ultraviolet curing resin film is cured over its entire portion other than the upper surfaces of the pixel control devices (the surfaces not in contact with the planar display substrate or transparent thermoplastic resin film). When the transparent ultraviolet curing resin film not cured on the upper surfaces of the pixel control devices is then removed, the transparent ultraviolet curing resin film cured with the ultraviolet rays is uniformly formed on the peripheral portions of the pixel control devices other than the upper surfaces thereof, with the result that wirings drawn out from the upper surfaces of the pixel control devices can stably be formed.

In any one of the first to sixth aspects, the pixel control devices are provided on the surfaces thereof with electrode pads for connecting signal lines and are desirably made from a silicon crystal chip or silicon polycrystal chip to have a length and width of 30 µm or more and 500 µm or less and a thickness of 20 µm or more and 100 µm or less from the standpoint of facilitating the mounting operation. Furthermore, formation of a silicon nitride film or silicon oxide film on the surfaces of the pixel control device is desirable from the viewpoint of protection of the pixel control devices and of the circuits formed thereon. Moreover, the pixel control devices produced by having a silicon crystal substrate or silicon polycrystal substrate given a function to control pixels are subjected to mechanical polishing on the back surface thereof to have a thickness of 20 µm or more and 100 µm or less and then to cutting by sandblasting or laser beam machining to have a length and width of 30 µm or more and 500 µm. This is further desirable from the viewpoint of the production efficiency and processing accuracy.

In any one of the first to sixth aspects, inside wirings for the pixel control devices that pass through the inside thereof and wirings for the planar display substrate are desirably formed through screen printing using a screen mask that has a predetermined pattern corresponding to these wirings. Desirably, the screen mask is a metal mask using thin metal foil.

Thus, the pixel control devices each controlling a plurality of pixels, are positioned among data lines, gate lines and pixel lines, and wirings, such the data lines, are to be formed in the longitudinal and lateral directions, with the pixel control devices as the centers. For this reason, the pixel control devices having inside wirings passing through the inside thereof are transferred by means of the selective transfer method according to any one of the first to sixth aspects of the invention, and wirings, such as data lines, for the planar display substrate that are to be connected to the internal wirings are then formed. Since the wirings, such as data lines, assume broken-line patterns, a screen mask having a predetermined pattern corresponding to the wirings, such as data lines, can be used. As a result, patterned wirings that are to be connected to the inside wirings can be formed through a method of directly printing and coating wiring material onto the planar display substrate. The conventional wiring formation method includes expensive and complicated steps of depositing a thin film over the entire surface of a planar display substrate, pattern-transferring the deposited thin film by the photolithography, etching the wiring material thin film, removing a photoresist film and the like steps and, since the screen mask as described above could be applied to the conventional wiring formation method, the screen printing could not be performed.

A seventh aspect of the invention provides a mounting apparatus for performing the method for selectively transferring pixel control devices according to any one of the first to sixth aspects, which comprises a pixel control device stage for disposing thereon a substrate for pickup and provided with a rotation angle adjustment mechanism, a substrate stage for disposing a planar display substrate thereon and provided with a rotation angle adjustment mechanism, a pickup device provided with a vacuum chuck that has vacuum chuckholes formed therein at an array pitch px in a direction corresponding to a first direction and an array pitch py in a direction corresponding to a second direction for chucking the pixel control devices and X-axis, Y-axis and Z-axis regulating mechanisms, which is used to selectively chuck and retain a number of the pixel control devices on the pickup device and then transfer the chucked and retained pixel control devices onto the planar display substrate and which has a function to move in three directions orthogonal to one another utilizing the X-axis, Y-axis and Z-axis regulating mechanisms.

Thus, the chuckholes formed in the portion of picking up the pixel control devices are arranged at the array pitch px in the direction corresponding to the first direction and at the array pitch py in the direction corresponding to the second direction. In accordance with the method of selectively transferring the pixel control devices according to any one of the first to sixth aspects, therefore, the pixel control devices can be mounted.

An eight aspect of the invention provides a wiring formation method after transfer of the pixel control devices for controlling a plurality of pixels according to any one of the first to sixth aspects, comprising the steps of forming wirings inside the pixel control devices so that the inside wirings pass through the pixel control devices and forming wirings on a planar display substrate by screen printing using a screen mask that has a predetermined pattern corresponding to the wirings formed on the planar display substrate and to be connected to the inside wirings of the pixel control devices in broken-line patterns.

Thus, the pixel control devices each controlling a plurality of pixels, are positioned among data lines, gate lines and pixel lines, and wirings, such the data lines, are to be formed in the longitudinal and lateral directions, with the pixel control devices as the centers. For this reason, the pixel control devices having inside wirings passing through the inside thereof are transferred by means of the selective transfer method according to any one of the first to sixth aspects of the invention, and wirings, such as data lines, for the planar display substrate that are to be connected to the internal wirings are then formed. Since the wirings, such as data lines, assume broken-line patterns, a screen mask having a predetermined pattern corresponding to the wirings, such as data lines, can be used. As a result, patterned wirings that are to be connected to the inside wirings can be formed through a method of directly printing and coating wiring material onto the planar display substrate. The conventional wiring formation method includes expensive and complicated steps of depositing a thin film over the entire surface of a planar display substrate, pattern-transferring the deposited thin film by the photolithography, etching the wiring material thin film, removing a photoresist film and the like steps and, since the screen mask as described above could be applied to the conventional wiring formation method, the screen printing could not be performed.

A ninth aspect of the invention provides a planar display substrate on which pixels, pixel control devices and wirings for connecting the pixels and the pixel control devices are formed, wherein the pixels are arrayed in i columns and j rows, and wherein each of the pixel control devices controls a plurality of pixels with one integrated circuit, is disposed at a substantially center of an area of a product of i×j and is connected to the pixels via wirings using a common region. Further, a tenth aspect of the invention provides a planar display substrate on which pixels, pixel control devices and wirings for connecting the pixels and the pixel control devices are formed, wherein the pixels are arrayed in i columns and j rows and wherein each of the pixel control devices controls a plurality of pixels with one integrated circuit, is disposed at a substantially center of an area of a product of i×j, is connected to the pixels via wirings using a common region and is transferred by the method according to any one of the first to sixth aspects.

Thus, the pixel control device is that controlling a plurality of pixels (or pixel electrodes) with a single integrated circuit, is disposed substantially at the center of the pixels in i columns and j rows and is connected to each pixel via the wirings. Therefore, the number of wirings to be used is reduced (wiring saving property), and the area of the light-blocking portions due to the presence of the wirings becomes small, thus contributing to enhancement of the aperture ratio. When i×j number of pixels is called a pixel block, why the pixel control device is disposed at the center of the pixels in i columns and j rows is that the center position is advantageous for controlling the pixels contained in the pixel block with one pixel control device. The lengths of the wirings from the center position to the pixels disposed symmetrically can be the same.

An eleventh aspect of the invention provides a planar display substrate according to the ninth or tenth aspect, wherein the product of i×j is a multiple of 3 and the pixel control devices control a plurality of pixels using a single integrated circuit 3, with 3 pixels of three different colors as a pixel group. According to this aspect, since three pixels comprising a combination of three primary colors (RGB) can be controlled with one pixel control device, the color phenomena and contrast become excellent. To be concrete, pixels in 2 columns and 6 rows, 6 columns and 2 rows, 2 columns and 12 rows, 4 columns and 12 rows and the like can be conceivable.

A twelfth aspect of the invention provides a planar display substrate according to the ninth or tenth aspect, wherein the pixel control devices control 3 colors×4 pixels arrayed in 2 columns and 6 rows with one integrated circuit and are disposed each at a center of the area of the product of 3×4.

According to this aspect, since three pixels comprising a combination of three primary colors (RGB) can be controlled with one pixel control device, the color phenomena and contrast become excellent. The pixel control device may be restricted to that merely controlling 3 colors×4 pixels in i columns and j rows. The pixels in 2 columns and 12 rows and in 4 columns and 12 rows are conceivable as concrete examples, provided that the increase in number of pixels increases the number of wirings to possibly deteriorate the aperture ratio. Therefore, preferably, the pixel control device controls 3 colors×4 pixels in 2 columns and 6 rows and is disposed at the center of the pixels in 2 columns and 6 rows.

A thirteenth aspect of the invention provides a planar display substrate according to any one of the ninth to twelfth aspects, onto which the pixel control devices are transferred by a method comprising the steps of fixing onto a support substrate a substrate for pixel control devices having a surface thereof provided with a plurality of integrated circuit each controlling a plurality of pixels, fixing onto a substrate for pickup the pixel control devices on the substrate for pixel control devices that has been cut into individual integrated circuit and transferring onto the planar display substrate the pixel control devices on the substrate for pickup that have been selectively chucked and retained on a pickup device. To be specific, it is desirable that the pixel control devices be transferred and produced in accordance with the transfer method for pixel control devices according to any one of the first to sixth aspects of the invention.

BRIEF DESCRIPTION OF THE DRAWINGS

FIG. 35 is an explanatory view showing the comparison between the contents of Patent Document 2 and those of the present invention.

BEST MODE FOR CARRYING OUT THE INVENTION

The embodiments of the present invention will be described herein below with reference to the accompanying drawings.

METHOD OF PRODUCING A PLANAR DISPLAY SUBSTRATE ACCORDING TO THE FIRST EMBODIMENT (1. Structure of a Liquid Crystal Display)

Figure 24:
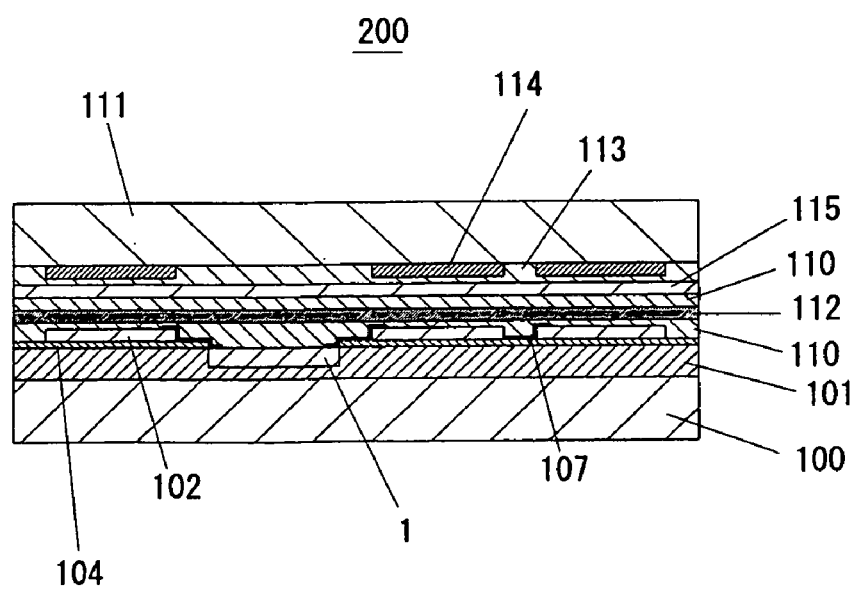
FIG. 24 is a cross section showing a liquid crystal substrate.

In the present embodiment, a method for producing a planar display substrate according to the present invention is applied to the production of a liquid crystal display. A liquid crystal display 200 has a structure, as shown in FIG. 24, comprising a planar display substrate 100, a color filter substrate 111 and a liquid crystal 112 interposed between them. The planar display substrate of plastic (also called the first substrate or array substrate) 100 has a pixel control device 1 and transparent electrodes (pixels) 102 formed thereon via a resin film 101 in matrix form on which an orientation film 110 is formed. On the other hand, the color filter substrate 111 has a color filter 114 formed thereon via a solvent resistant layer 113 so that the color filter is opposed to the transparent electrodes 102. On the surface of the solvent resistant layer, a transparent electrode for color filter and an orientation film 110 are formed. The pixel control device 1 is formed of a plurality of thin film transistors (TFTs) and controls a plurality of transparent electrodes 102 to control on-off operation and light and shade of each pixel.

(2. Method for Selectively Transferring Pixel Control Devices)

Figure 25:
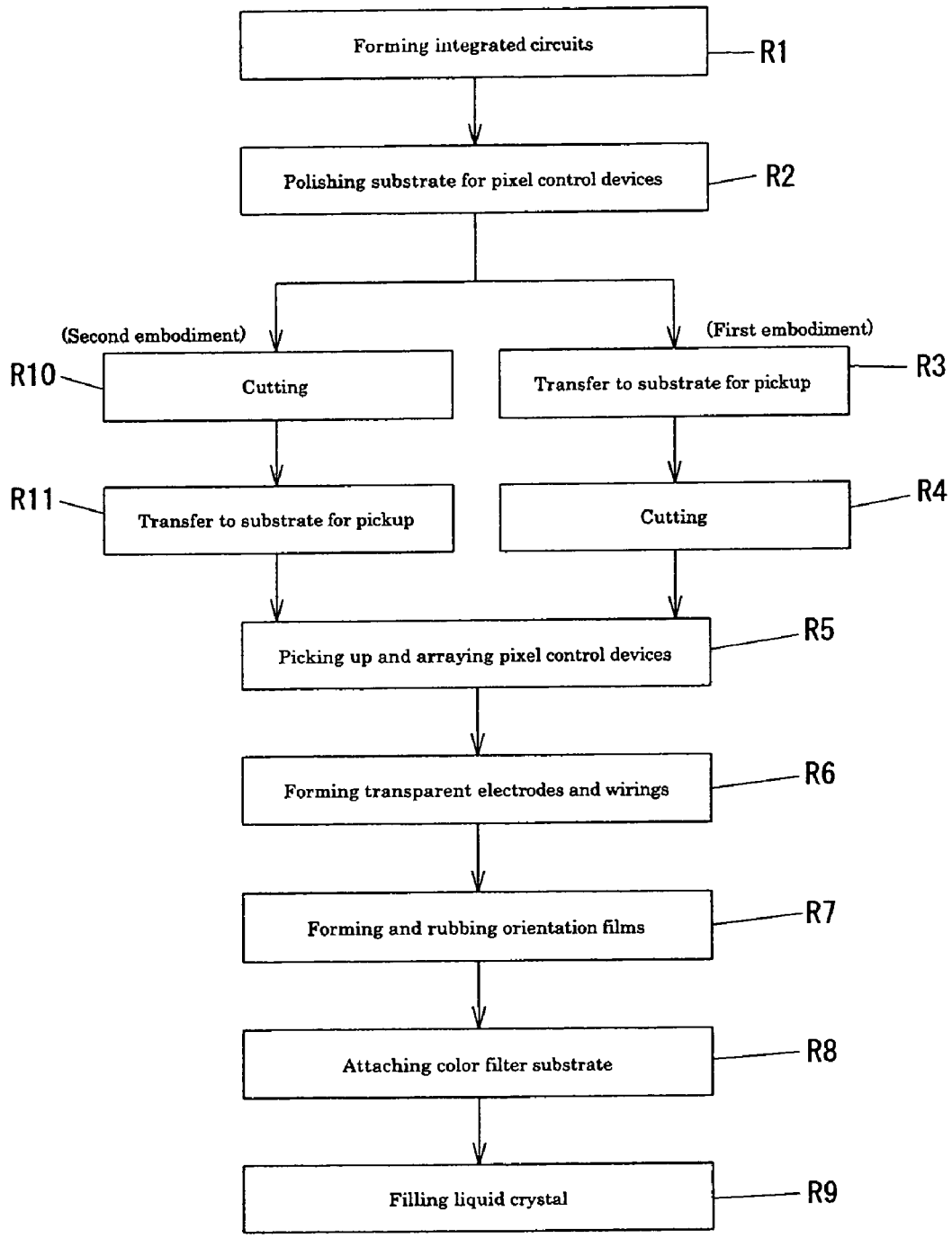
FIG. 25 is a flow chart showing a process for manufacturing a liquid crystal substrate.

The liquid crystal display 200 having the structure described above is produced through a production method shown in FIG. 25. The method comprises a step R1 of forming integrated circuits 3 for controlling a plurality of pixels on a substrate 2 for pixel control devices and fixing the formed circuits onto a support substrate 7, a step R2 of polishing the pixel control device substrate 2, a step R3 of transferring the pixel control device substrate 2 to a substrate 9 for pickup, a step R4 of performing cutting into pixel control devices 1, a step R5 of transferring the pixel control devices 1 onto the planar display substrate 100 using a pickup apparatus 51, a step R6 of forming the transparent electrodes and wirings, a step R7 of forming and rubbing the orientation film, a step R8 of attaching the color filter substrate and a step R9 of filling a liquid crystal.

Figure 1:
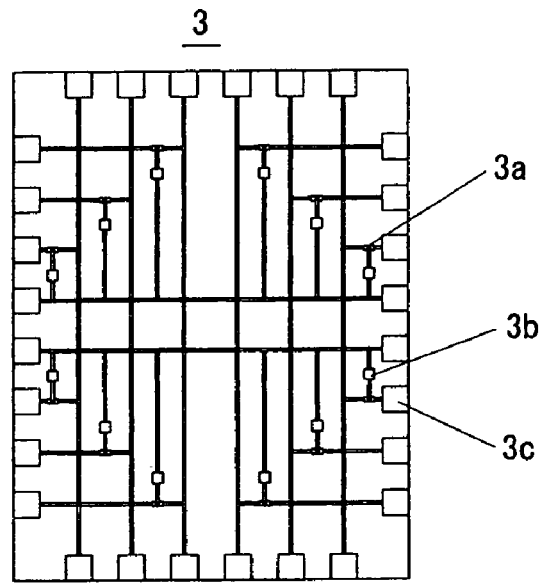
FIG. 1 is a schematic plan view showing an integrated circuit.
Figure 2:
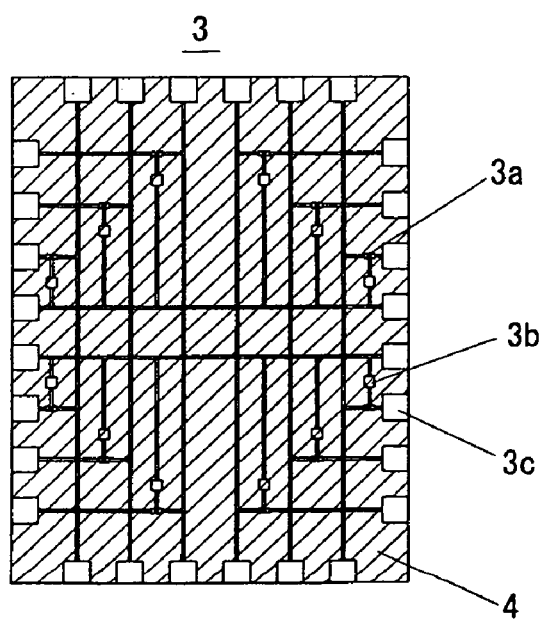
FIG. 2 is a plan view showing the state in which a protective film has been formed on the integrated circuit.
Figure 33:
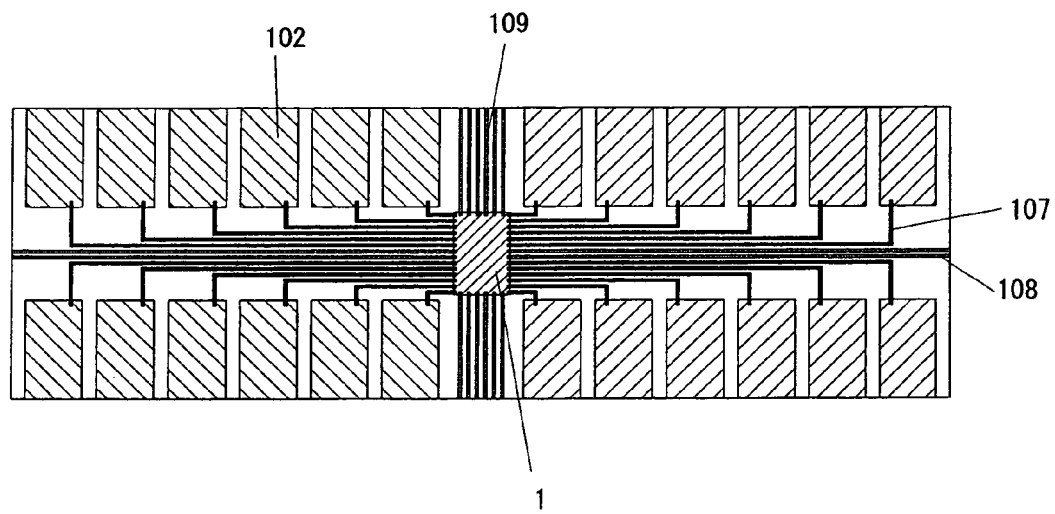
FIG. 33 is a plan view showing another example of an array of pixels according to the present invention.
Figure 34:
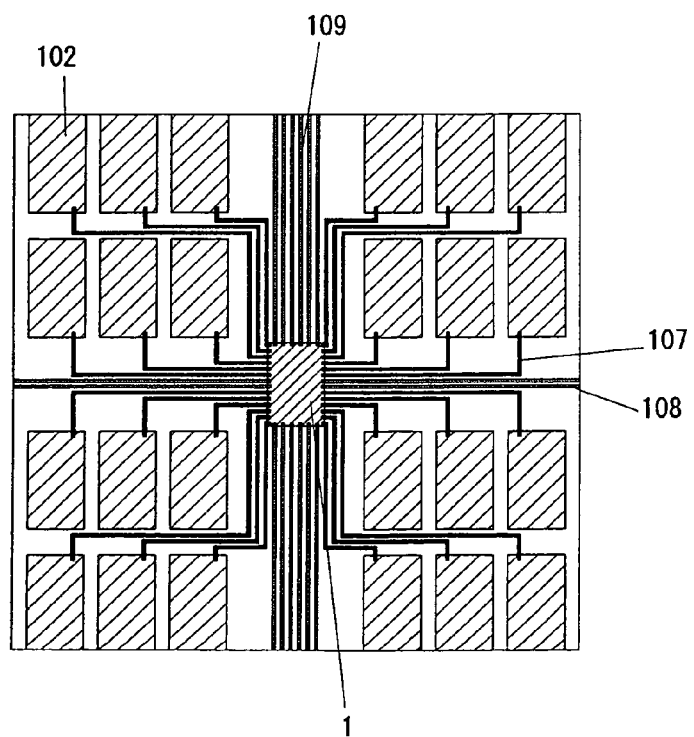
FIG. 34 is a plan view showing still another example of an array of pixels according to the present invention.
Figure 37:
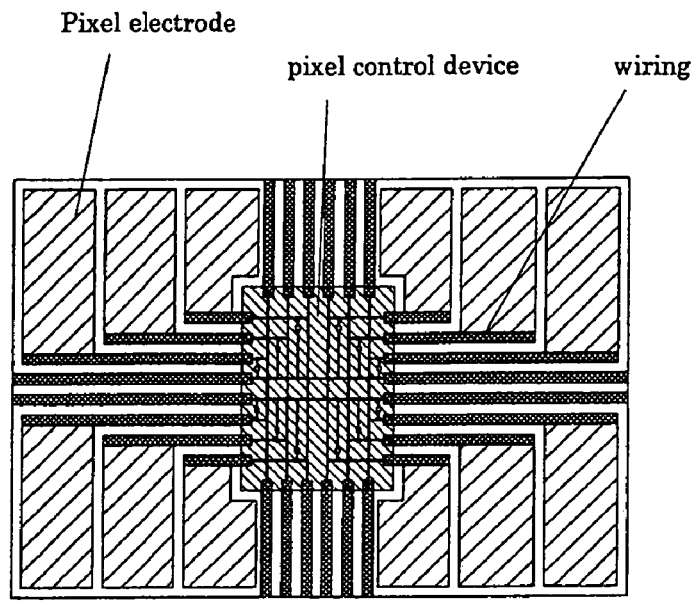
FIG. 37 is a plan view showing the disposition of a pixel control device and the array of pixels according to the present invention.
Figure 38:
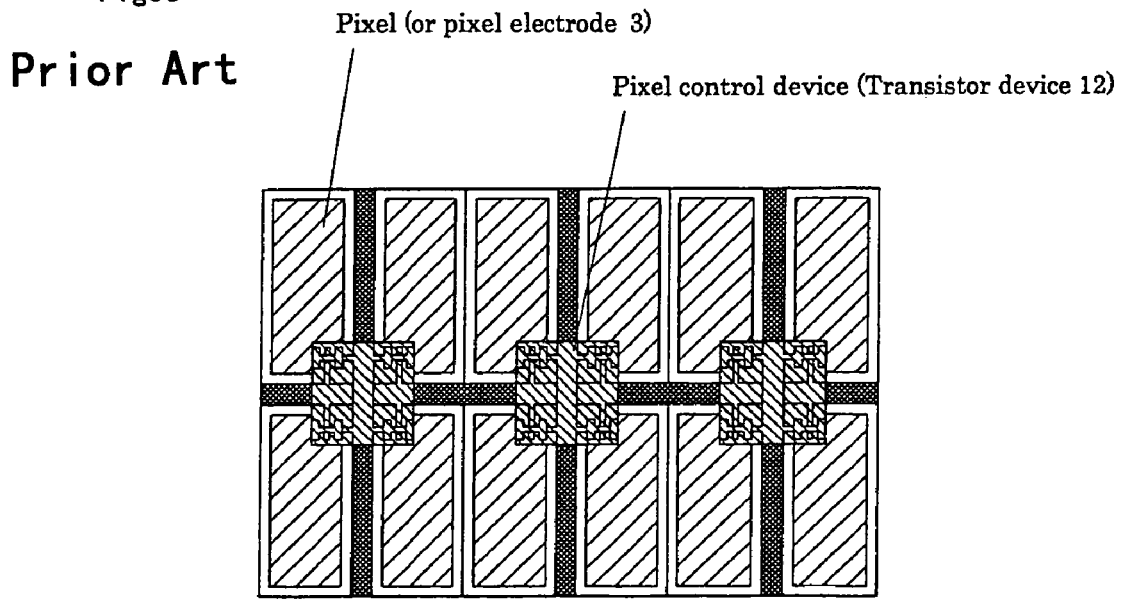
FIG. 38 is a plan view showing the disposition of pixel control devices and the array of pixels according to prior art.

In step R1, first, integrated circuits 3 for controlling a plurality of pixels are formed on a crystal silicon substrate or polycrystal silicon substrate (hereinafter referred to as a silicon substrate) 2 serving as the pixel control device substrate 2. The formation of the integrated circuits 3 on the silicon substrate 2 is performed according to the conventional semiconductor-fabricating method. One example of integrated circuit 3 is shown in FIG. 1. The integrated circuit 3 shown in FIG. 1 has formed thereon twelve electronic devices 3$a$ that are thin film transistors for controlling pixels. To be specific, a single integrated circuit 3 can control 3 (three colors of RGB)×4 pixels. Electrode pads 3$c$ for connecting current-retaining circuits 3$b$ of pixels and signal lines, such as pixel lines 107 etc., are also formed on the integrated circuit. After the formation of such an integrated circuit 3, a silicon nitride or silicon oxide film 4 is deposited on the integrated circuit at portions other than those of the electrode pads 3$c$ to protect the integrated circuit 3, as shown in FIG. 2. To retain the linearity of wirings relative to pixels distant from the pixel control device 1 in the row direction, wirings of rows are linearly formed (merely linear wirings infallibly connect the pixel control device and the pixels, as shown in FIG. 37.) The lengths of 12 pixels of 3 colors×4 pixels can be made longer and longer as the positions thereof are distant from the pixel control device 1 (FIG. 37). In another example of the array of pixels having "i" columns and "j" rows, the product of "i" and "j" is a multiple of 3, and the pixel control device 1 controls a plurality of pixels with a single integrated circuit 3, with 3 pixels of three different colors as a pixel group. As shown in FIG. 33 in which pixels of 2 columns and 12 rows are arrayed, it is possible for a single integrated circuit 3 to control 8 pixel groups (control 24 pixels that are an integer multiple of 3, with three pixels of three different colors as a pixel group). As shown in FIG. 34 in which pixels of 4 columns and 6 rows are arrayed, it is also possible for a single integrated circuit 3 to control 8 pixel groups. While the pixel control device 1 disposed at the center of the array is that controlling a plurality of pixels with a single integrated circuit 3, it may be that connected to each pixel via wirings using a common region. Thus, this pixel array can be applied to a pattern having pixels of "i" columns and "j" rows. In this embodiment, since the pixel control device 1 is that controlling a plurality of pixels (or pixel electrodes) with a single integrated circuit 3 and is disposed at the center of the pattern having pixels of "i" columns and "j" rows and connected to each pixel via the wirings, it is possible to realize reduction of the number of the wirings (wiring number reduction capability) and reduce the area of light-blocking portions resulting from the wiring formation, resulting in contribution to the enhancement of the aperture ratio. The number of wirings used herein means the number of wiring groups comprising bundles of wirings disposed in the row direction or column direction (aggregation of data lines 109 or aggregation of pixel lines and gate lines 108, in the present embodiment).

Figure 3:
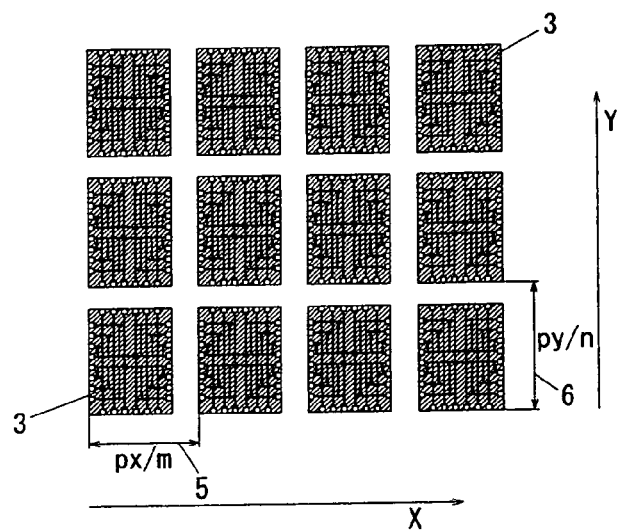
FIG. 3 is a plan view showing the state in which integrated circuits have been formed on a silicon substrate.
Figure 4:
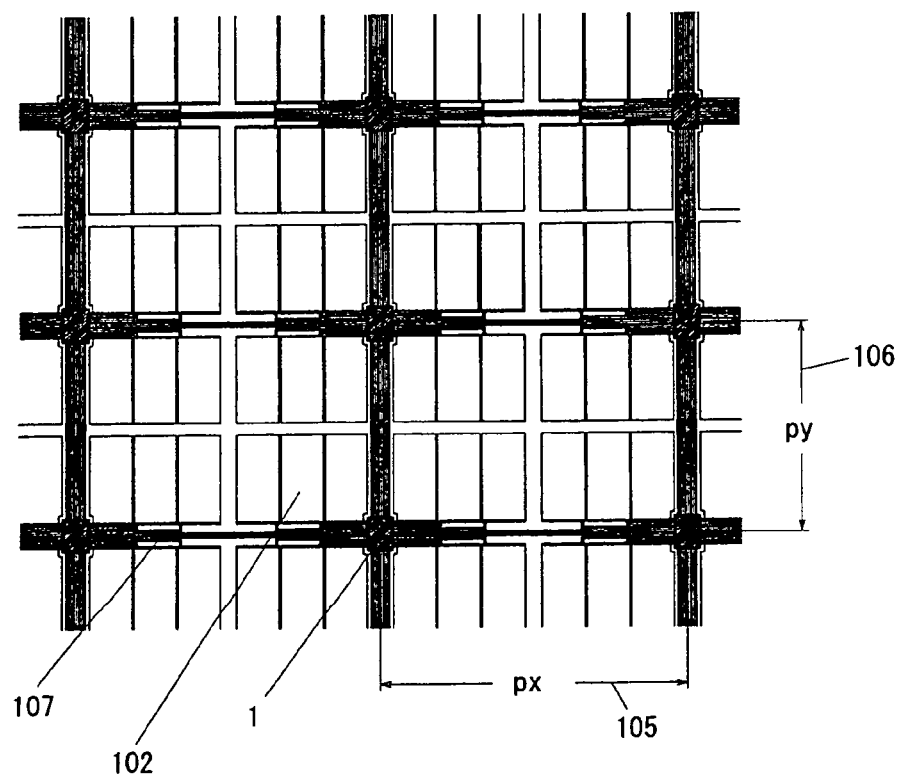
FIG. 4 is a plan view showing a planar display substrate.
Figure 5:
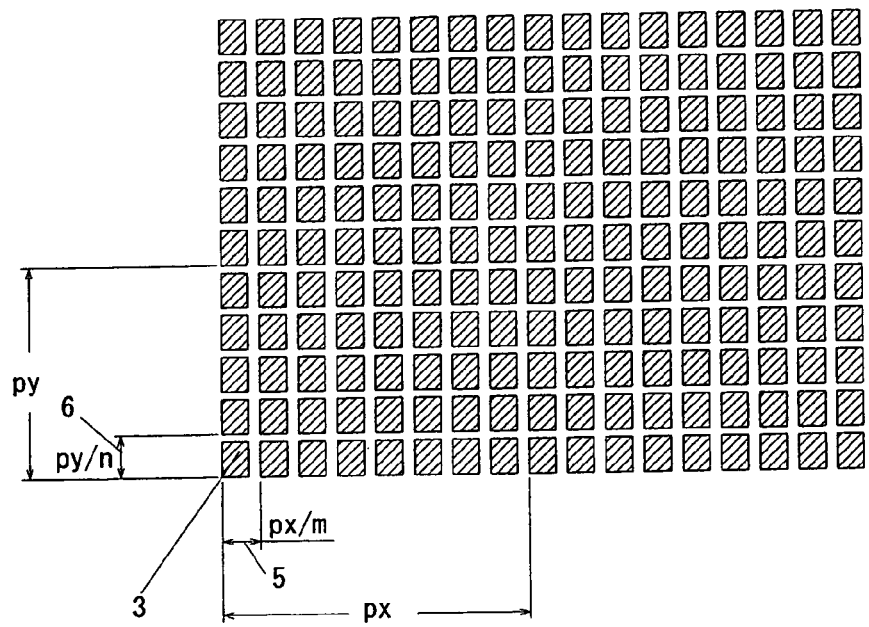
FIG. 5 is a plan view showing a silicon substrate.
Figure 6:
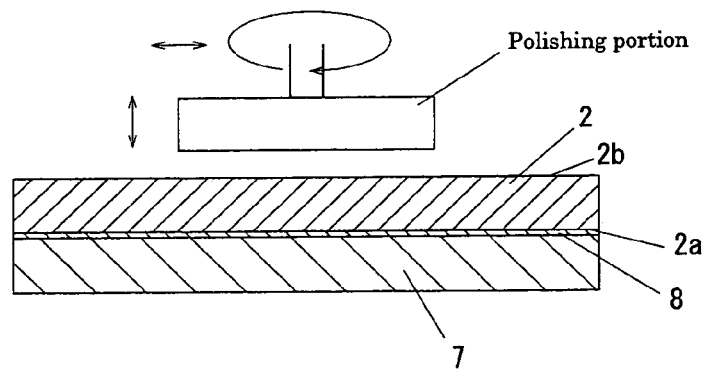
FIG. 6 is a cross section showing mechanical machining of the silicon substrate.

As shown in FIG. 3, a plurality of integrated circuits 3 as shown in FIG. 1 are formed on the silicon substrate 2 at regular intervals. The regular intervals (pitches) 5 and 6 correspond respectively to pitches 105 and 106 on the planar display substrate 100, as will be described later. When controlling 3 colors ×4 pixels with a single integrated circuit 3, the pixel control devices 1 are mounted as shown in FIG. 4 on the planar display substrate 100 at the pitch 105 in the first direction X and at the pitch 106 in the second direction Y. As shown in FIG. 5, the pitches 5 and 6 for integrated circuits 3 formed in plural numbers on the silicon substrate 2 are determined, with the pitches 105 and 106 as the standards at which a natural number "m" of pixel control devices 1 and a natural number "n" of pixel control devices 1 are formed. To be specific, when representing the pitch 105 in the first direction X as px and the pitch 106 in the second direction Y as py on the planar display substrate 100, the pitch 5 in the first direction X and the pitch 6 in the second direction Y on the silicon substrate are represented by px/m and py/n, respectively, as shown in FIG. 6. The front surface of the silicon substrate 2, i.e. the surface 2a on which the integrated circuits 3 are formed, is fixed onto the support substrate 7 using a first adhesive tape 8.

In step R2, the rear surface of the silicon substrate 2, i.e. the surface 2b on which no integrated circuit 3 is formed, is mechanically polished to reduce the thickness of the silicon substrate 2 to around 20 to 100 μm. As the first adhesive tape 8, a thermally exfoliative tape that lowers its adhesive force by means of predetermined heat.

Figure 7:
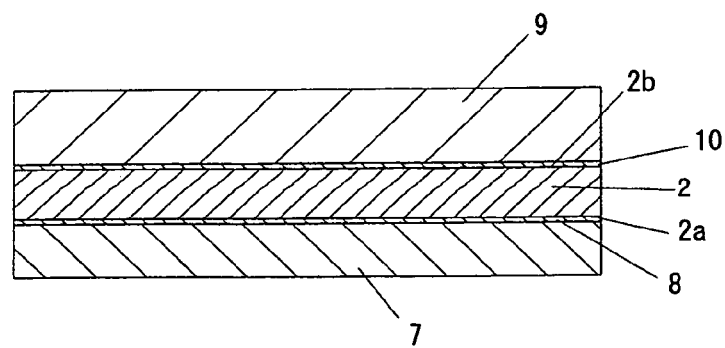
FIG. 7 is a cross section showing the state before the silicon substrate is intended to be upside down.

In step R3, the silicon substrate 2 is transferred onto the substrate 9 for pickup. To be specific, the rear surface 2b of the silicon substrate 2 is attached to the pickup substrate 9 with a second adhesive tape 10, as shown in FIG. 7, and the first adhesive tape 8 is then heated via the support substrate 7 to exfoliate the first adhesive tape 8 and support substrate 7. Thus, the silicon substrate 2 is transferred from the support substrate to the pickup substrate 9. At this time, the surface 2a having the integrated circuits formed thereon becomes the front surface of the silicon substrate. The first and second adhesive tapes 8 and 10 are selected so that the exfoliation temperature of the first adhesive tape 8 is lower than that of the second adhesive tape 10. This selection prevents induction of defects, such as positional deviation, because the adhesive force between the pickup substrate 9 and the silicon substrate 2 is not reduced even when the heat to the first adhesive tape 8 has been transferred by conduction to the second adhesive tape 10 via the silicon substrate 2.

Alternatively, adhesion means of the adhesive tapes 8 and 10, i.e. means for varying their adhesive force, are made different. For example, the first adhesive tape 8 is a tape reduced in its adhesive force by irradiation with ultraviolet rays while the second adhesive tape 10 is a thermally exfoliative tape. With this, the second adhesive tape 10 will not reduce its adhesive force through the irradiation of ultraviolet rays for exfoliating the first adhesive tape 8.

In subsequent step R4, the silicon substrate 2 is cut into individual integrated circuit 3 into chips to produce pixel control devices 1. This cutting is attained by means of etching, sandblasting, laser beam machining, dicing, etc. From the standpoint of the production efficiency, sandblasting that performs cutting through high-pressure high-speed jetting of powders, such as alumina powders, from a nozzle is most advantageous. When it is intended to process the shape of the pixel control devices 1 with high precision, appropriate is laser beam machining that performs cutting utilizing laser light shift. While etching that uses plasma, so called dry etching, can be used for this cutting, since the processing speed thereof is later than that of other processes, the production efficiency is lower. Wet etching using a drug solution possibly deteriorates the processing precision of pixel control devices 1 owing to flow of the drug solution. Dicing performing mechanical cutting have a possibility of its die cutting blades flicking off the pixel control devices 1. Therefore, the dry etching, wet etching and dicing are inferior in yield. Thus, the selection of the cutting processes is of importance. In the case of cutting the silicon substrate 2 to a thickness of around 20 to 100 μm as in the present embodiment, sandblasting or laser beam machining is appropriate. In this embodiment, an example of sand blasting will be described.

Figure 9:
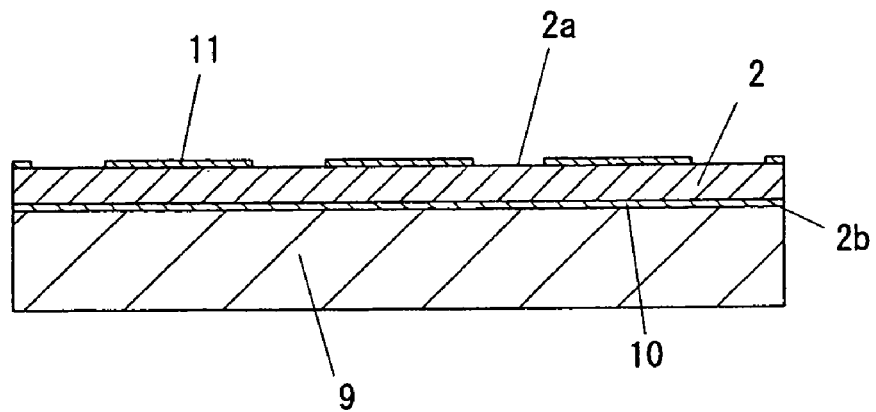
FIG. 9 is a cross section showing the state the silicon substrate has been subjected to patterning.
Figure 10:
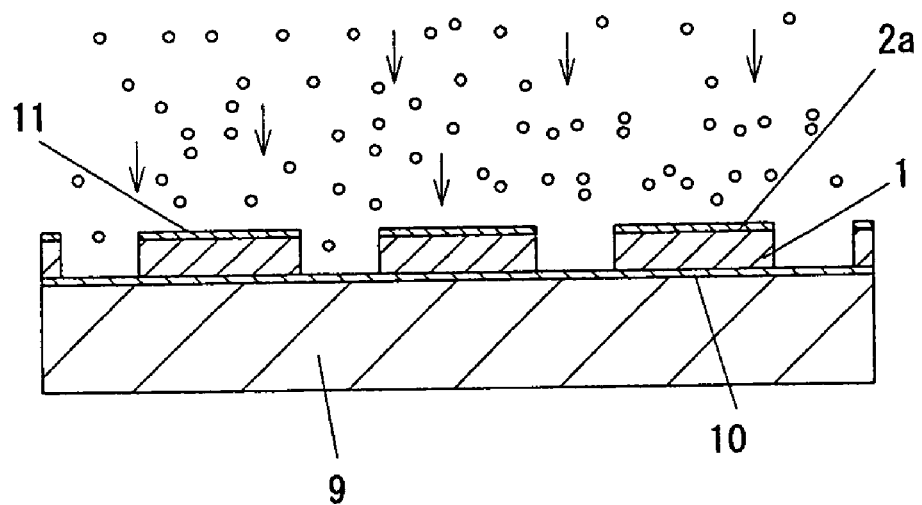
FIG. 10 is an explanatory view showing sand blast processing.
Figure 11:
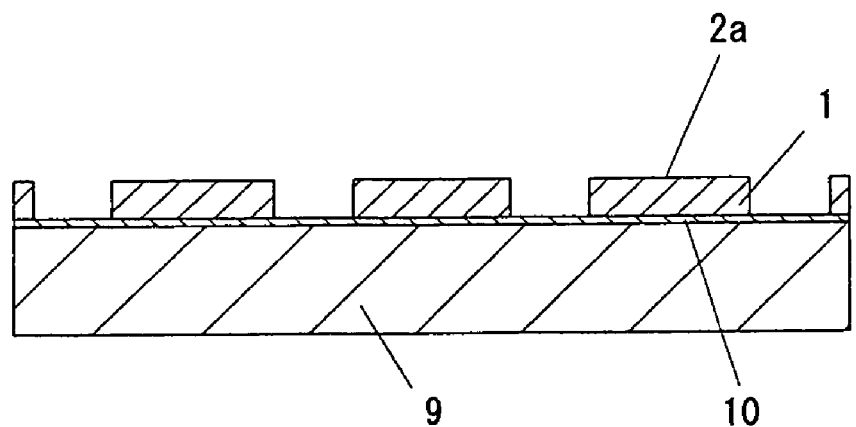
FIG. 11 is a cross section showing the silicon substrate in the state in which photoresists have been removed.

FIGS. 9 and 10 illustrate the cutting step according to sandblasting. After the thin film formation of the silicon substrate 2 by means of mechanical polishing and transfer thereof onto the pickup substrate 9, positional alignment of the integrated circuits formed on the silicon substrate 2 and patterning of the pixel control devices 1 are conducted so that cutting can be performed between the adjacent integrated circuits. Photolithography or the like is used to perform this patterning. FIG. 9 illustrates the state assumed after performing the patterning by means of the photolithography. Sandblasting is then performed as shown in FIG. 10, with photoresists 11 formed in consequence of the patterning as masks. The photoresists 11 are exfoliated from the individual pixel control devices cut. FIG. 11 illustrates the state in which the photoresists 11 have been exfoliated.

In the stage shown in FIG. 11, the pixel control devices 1 are arrayed on the substrate 9 for pickup in such a state that the pitch 5 in the first direction X is px/m and that the pitch 6 in the second direction Y is py/n. In subsequent step R5, the pickup substrate 9 is heated at low temperature to lower the adhesive force of the adhesive tape 10, and a given pixel control device 1 alone is picked up from the pixel control devices thus arrayed and is disposed on the planar display substrate 100. While the heating of the pickup substrate 9 may be continued until termination of the pickup step, the heating may be performed only around the pixel control device 1 to be picked up at the pickup step. With this, the heating time and the amount of heat can be saved. Also when using as the second adhesive tape 10 a tape lowering its adhesive tape through irradiation with ultraviolet rays and as the pickup substrate 9 a substrate that is transparent to ultraviolet rays, irradiating only the portion around the pixel control device 1 to be picked up with ultraviolet beams for a short period of time enables the time required to lower the adhesive force of the adhesive tape 10 and the amount of heat (the amount of ultraviolet rays used for irradiation) to be reduced.

Figure 12:
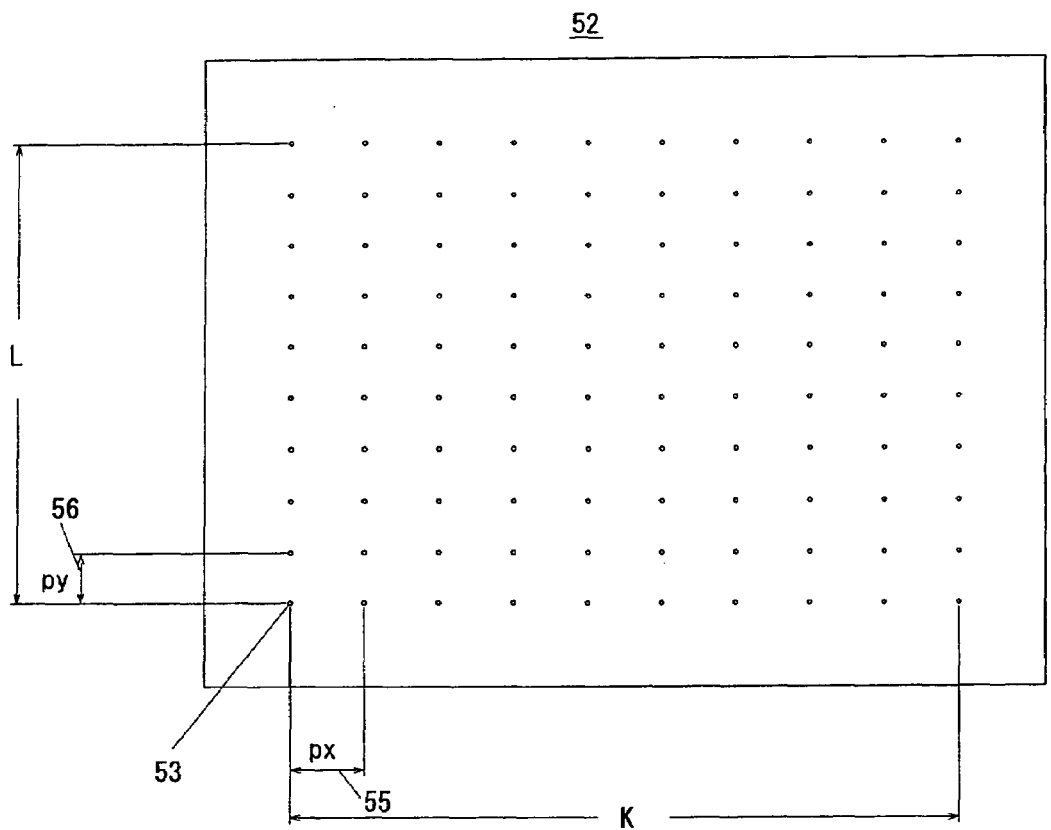
FIG. 12 is a plan view showing a vacuum chuck.

FIG. 12 illustrates a vacuum chuck 52 of the pickup device 51 that performs the pickup at step R5. The chucking surface of the vacuum chuck 52 is coated with a fluorine resin. The fluorine resin also serves as a parting agent for a transparent thermoplastic resin film 101. Vacuum chuckholes 53 for performing chuck (chucking) of the pixel control device 1 are formed in the chucking surface in the first direction X in columns of a natural number K at the same array pitch 55 (i.e. px) as the pixel control devices 1 on the planar display substrate 100 and in the second direction Y in rows of a natural number L at the same pitch 56 (i.e. py). Therefore, the vacuum chuck 52 enables the pixel control devices 1 satisfying the pitch 105 in the first direction X and the pitch 106 in the second direction Y on the planar display substrate 100 to be picked up at a time by the maximum number of "K×L" and the picked-up "K×L" number of pixel control devices to be transferred at a time onto the planar display substrate 100.

Figure 13:
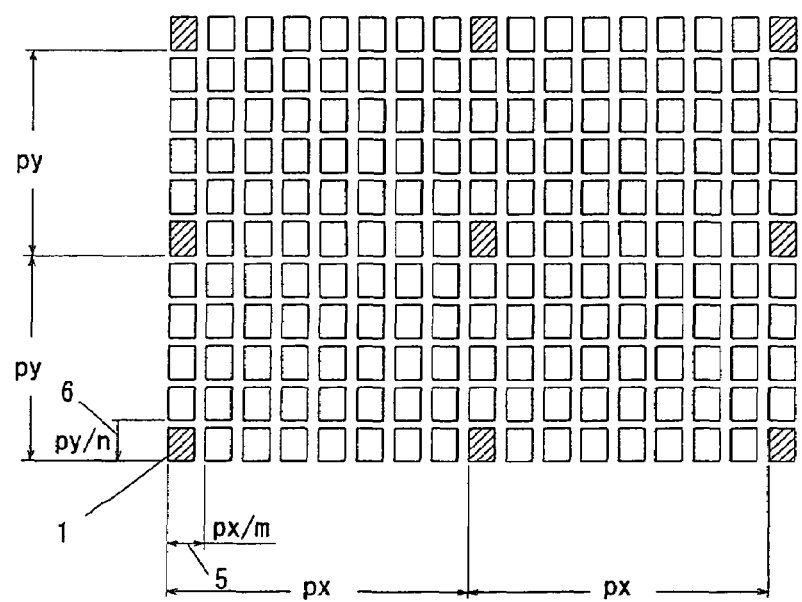
FIG. 13 is an explanatory view showing the selection of pixel control devices.
Figure 14:
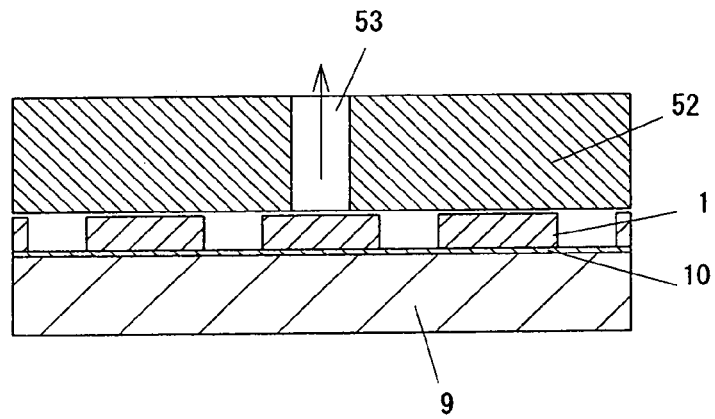
FIG. 14 is a cross section showing the pickup of a pixel control device.

FIG. 13 illustrates one example of pixel control devices 1 to be picked up with the vacuum chuck 52, as shown by oblique lines, from the pixel control devices regularly arrayed at the pitch 5 (i.e. px/m) in the first direction X and at the pitch 6 (i.e. py/n) in the second direction Y. That is to say, since the pixel control devices are selected every natural number m (at "m−1" intervals) in the first direction X and every natural number n (at "n−1" intervals) in the second direction Y, the pixel control devices 1 shown by oblique lines are selectively picked up. When performing the second pickup, the vacuum chuck 52 is positioned as shifted by the pitch px/m, for example, in the first direction X (in the right-hand direction in FIG. 13) on the pickup substrate 9. As a result, the pixel control devices 1 each adjoining on the right side of the pixel control devices 1 already picked up (those shown by oblique lines in FIG. 13) can selectively picked up in the same manner as in the first pickup. This selective pickup operation can be repeated by the maximum times of "m×n." FIG. 14 illustrates the state picking up a pixel control device 1 using the vacuum chuck 52. In this way, selective transfer of pixel control devices 1 is performed once or a plurality of times to transfer the pixel control devices 1 onto the entire surface of the planar display substrate 100.

A method of fixing the picked-up pixel control devices 1 to the planar display substrate 100 will next be described.

Figure 15:
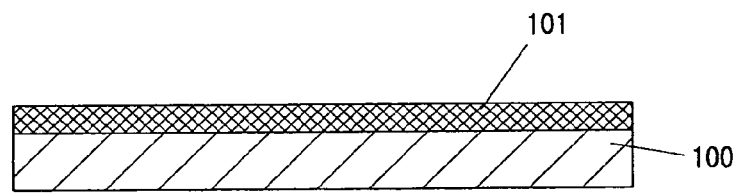
FIG. 15 is a cross section showing the planar display substrate that has been laminated with a thermoplastic resin film.
Figure 16:
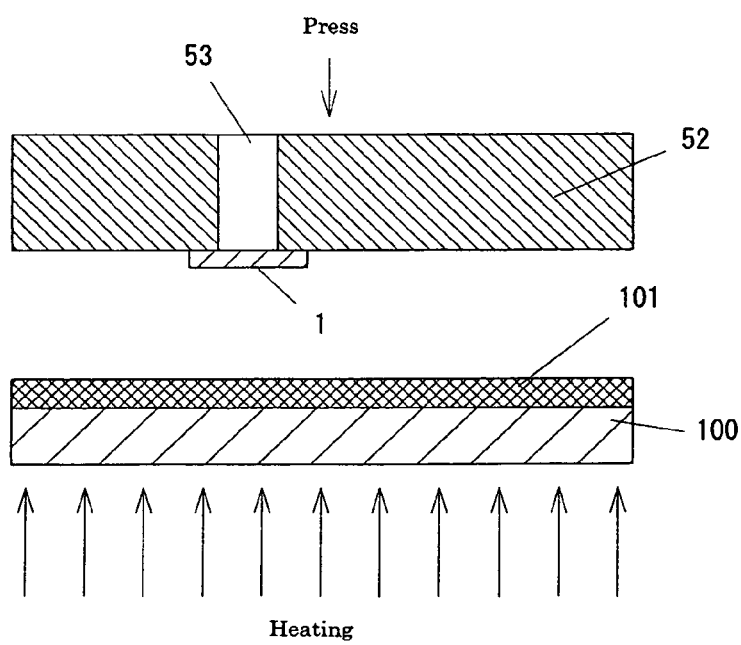
FIG. 16 is an explanatory view showing mounting of a pixel control device.

As shown in FIG. 15, the surface of the planar display substrate 100 is laminated with the transparent thermoplastic resin film 101. In place of using the laminated transparent thermoplastic resin film 101, a transparent thermoplastic resin is applied onto the surface of the planar display substrate 100 to form a film thereon. With the planar display substrate heated in advance before transfer of the pixel control device 1 using a heater or other such heating device, as shown in FIG. 16, the picked-up pixel control device 1 is transferred onto, as buried in, the transparent thermoplastic resin film 101 that has been made plastically deformable to an appropriate extent.

Alternatively, the picked-up pixel control devices 1 placed on the transparent thermoplastic resin film 101 is subjected to pressing to transfer them onto the film as buried therein. Since the state of adherence between the pixel control devices 1 and the transparent thermoplastic resin film 101 is weak at this time because the film is not sufficiently heated, there is a possibility of the pixel control devices 1 being slightly shifted in position at the moment of the pixel control devices chucked with the vacuum chuck 52 being brought into contact with the transparent thermoplastic resin film 101 and then separated from the vacuum chuckholes 53. In view of this, compressed air is blown from the vacuum chuckholes 53 when the pixel control devices 1 are separated from the vacuum chuckholes 53. By placing the pixel control devices 1 on the transparent thermoplastic resin film 1 using the pressure of the compressed air, the pixel control devices 1 are intimately adhered to the transparent thermoplastic resin film 101. Thus, the pixel control devices 1 can infallibly be separated from the vacuum chuckholes 53 and prevented from being shifted in position on the transparent thermoplastic resin film 101.

Pressing is performed with a press after the transparent thermoplastic resin film 101 is heated to make it deformable after or when the pixel control devices 1 have been disposed thereon. Otherwise, a heated press may be used. At the time (timing) of pressing, all the pixel control devices 1 disposed on the film are pressed in a lump against the planar display substrate 100. Otherwise, pressing may be performed when an optional number (the number that can occupy a predetermined area of the planar display substrate 100, for example) of pixel control devices 1 have been disposed on the film. At this time, it is desirable to chip off the portion of the vacuum chuck 52 by a thickness equal to or larger than the thickness of the pixel control devices, with the peripheries of the vacuum chuckholes 53 slightly left remaining. The regions that are around the vacuum chuckholes 53 and are concealed by the pixel control devices 1 when the pixel control devices 1 are chucked in the chuckholes 53, for example, are left remaining and other portions are chipped off as described above. With this, the positional deviation of the pixel control devices 1 that have already been disposed on the film due to the interference thereof with the vacuum chuck 52 (particularly the side edge portions thereof) can be prevented. The pixel control devices 1 on the substrate 9 for pickup, which have not yet been picked up (i.e. the pixel control devices that have not yet been disposed on the film), can also be prevented from being deviated in position and being damaged due to the interference of the vacuum chuck 52 at the time of the pickup.

As another method for burying the pixel control devices 1 in the transparent thermoplastic resin film 101, there is a locally heating method using the irradiation of laser beams. In this case, since the portion of the transparent thermoplastic plastic film onto which a pixel control device 1 is to be transferred is locally plasticized, the transparent thermoplastic plastic film around the pixel control devices 1 that have already been transferred is prevented from being deformed. Therefore, the positional deviation of the pixel control devices by the deformation can also be prevented.

Figure 17:
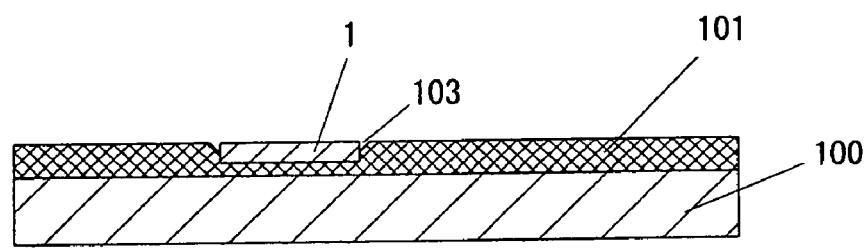
FIG. 17 is a cross section showing the planar display substrate having the pixel control device mounted thereon.

Since the surface of the vacuum chuck 52 for chucking the pixel control devices 1 (chucking surface) is coated with fluorine resin, there is no possibility of the transparent thermoplastic resin film 101 adhering to the chucking surface. According to the present invention, as described above, since the pixel control devices 1 can infallibly be disposed on the transparent thermoplastic resin film 101 with high precision, it is possible to eliminate the conventional step of forming recesses in advance in the transparent thermoplastic resin film 101 as is required in Patent Document 1 and Non-patent Document 1. FIG. 17 shows the state in which a pixel control device 1 has been transferred onto, as buried in, the transparent thermoplastic resin film 101.

Figure 18:
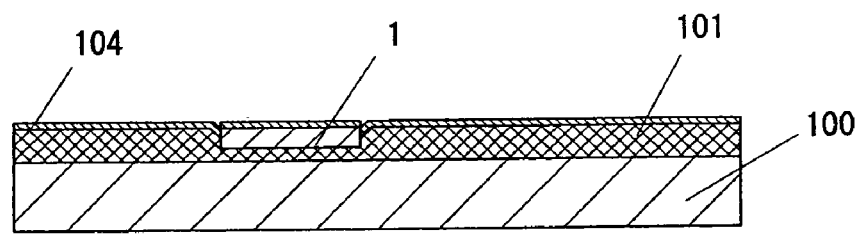
FIG. 18 is a cross section showing the planar display substrate to which a transparent ultraviolet curing resin film has been applied.
Figure 19:
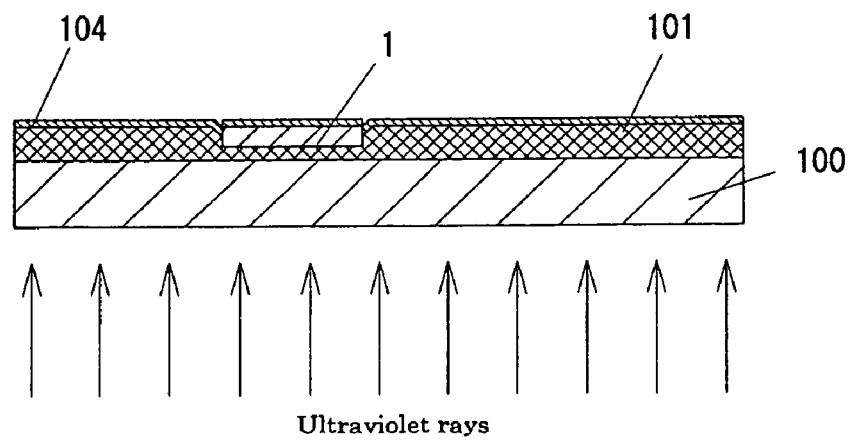
FIG. 19 is an explanatory view showing irradiation with ultraviolet rays.
Figure 20:
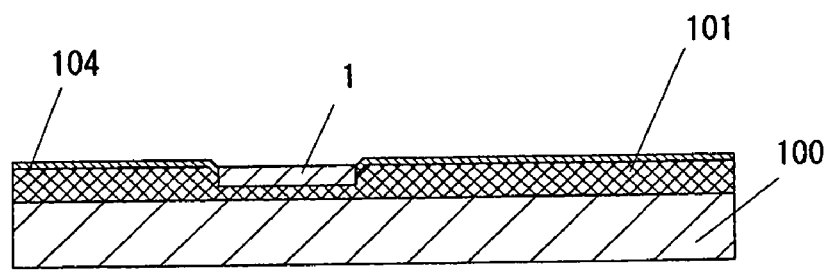
FIG. 20 is a cross section showing the planar display substrate in the state in which the ultraviolet curing resin film has been partially removed.

When the pixel control device 1 has been transferred onto, as buried in, the transparent thermoplastic resin film 101, as shown in FIG. 17, there is a case where a concave deformation 103 is generated in the transparent thermoplastic resin film in the vicinity of the transferred pixel control device 1. In order to flatten the concave deformation and infallibly fix the pixel control device 1 in position, a transparent ultraviolet curing resin film 104 is applied to the side of the planar display substrate 100 on which the pixel control device 1 has been transferred, as shown in FIG. 18 and, as shown in FIG. 19, the opposite side of the planar display substrate is irradiated with ultraviolet rays. Since the planar display substrate 100 and the transparent thermoplastic resin film 101 are transparent to ultraviolet rays, the portion of the transparent ultraviolet curing resin film 104 that is not transparent to the ultraviolet rays other than the surface of the pixel control device 1 is cured. The portion of the transparent ultraviolet curing resin film on the pixel control device 1 that has not been cured is then removed. FIG. 20 shows the planar display substrate 100 assumed after the removal treatment. The transparent ultraviolet curing resin film 104 is selected from among those of materials that are resistant to an organic solvent that is used subsequently when assembling the liquid crystal display. By so doing, the transparent thermoplastic resin film 101 can be protected from the organic solvent.

Wiring formation method

Figure 21:
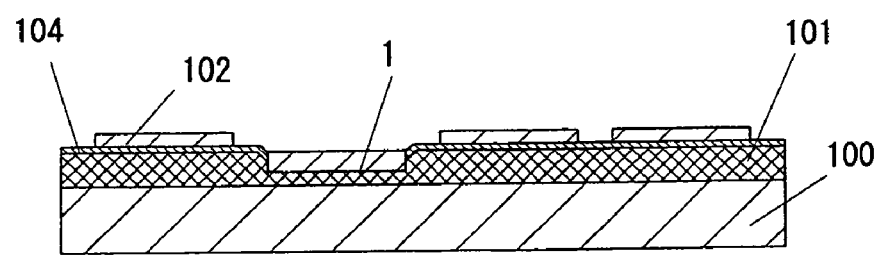
FIG. 21 is a cross section showing the planar display substrate having transparent electrodes formed thereon.
Figure 22:
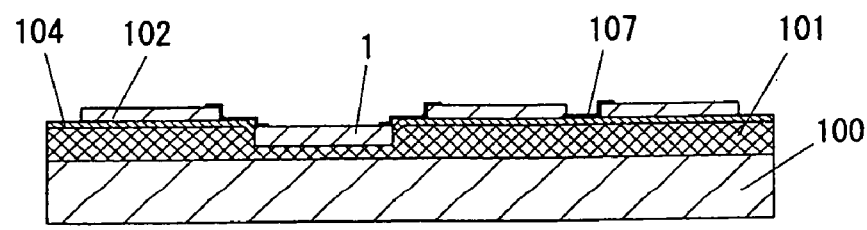
FIG. 22 is a cross section showing the planar display substrate having wirings formed thereon.
Figure 23:
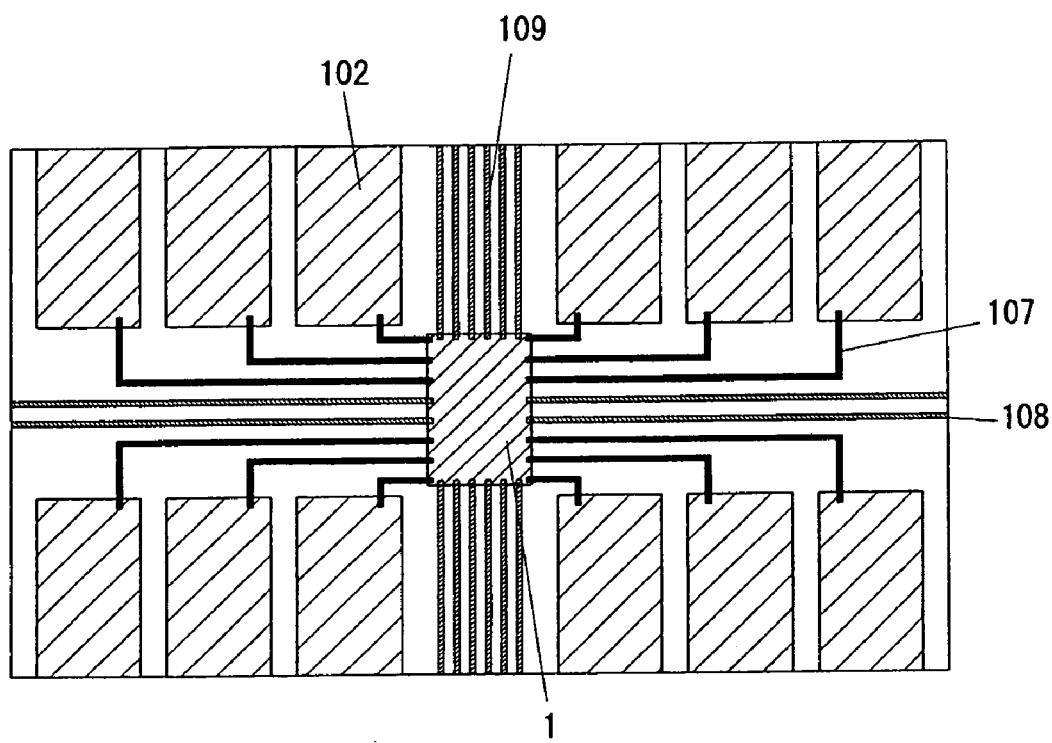
FIG. 23 is a plan view showing the planar display substrate.

After fixation of the pixel control devices 1 onto the planar display substrate 100 with the method described above, a transparent electrode (pixel or pixel electrode) 102 is formed at step R6 on the surface of the planar display substrate 100, as shown in FIG. 21. Wirings, such as wirings (pixel lines) 107, gate lines 108, data lines 109, etc. are then formed between the pixel control devices 1 and the transparent electrode 102, as shown in FIGS. 22 and 23.

Figure 32A:
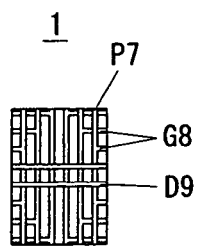
FIG. 32($a$) is a diagram for comparing an example of a pixel control device having wirings formed and passed through the interior thereof and an example of a screen mask used in wiring formation through screen printing using the pixel control device with the plan view of the planar display substrate, and FIG. 32($b$) is a diagram showing the screen mask matching with a planar display substrate shown in FIG. 32($c$).
Figure 32B:
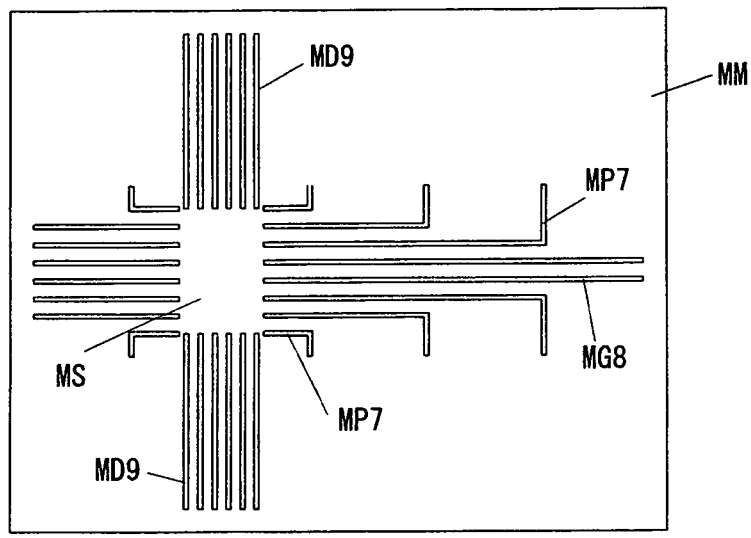
Figure 32C:
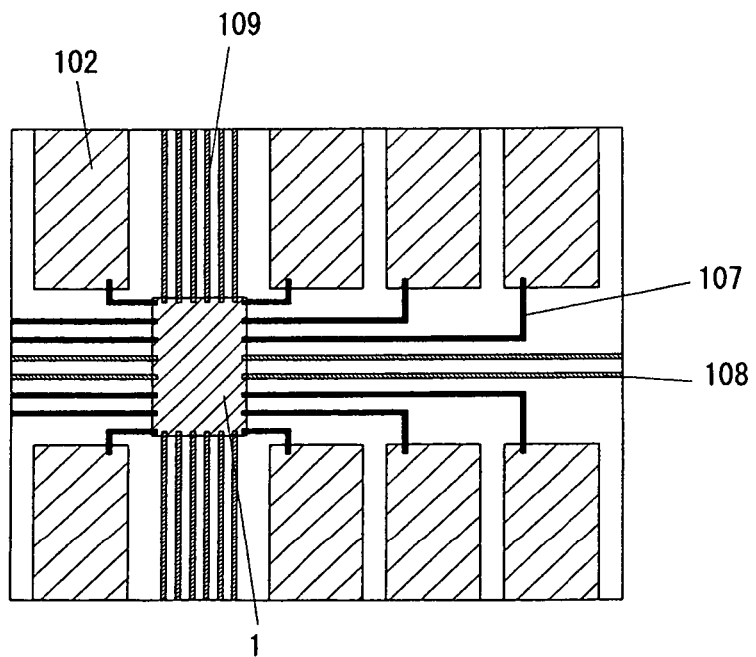

In the present embodiment, the pixel control device 1 for controlling a plurality of pixels and the wirings comprising gate lines 108, data lines 109 and pixel lines 107 are pattern-formed using a printing coating method by screen-printing using a screen mask MM. In the pixel control device 1 for controlling a plurality of pixels, internal wiring patterns D9, P7 and G8 each having a multi-layer structure are formed so as to pass through the interior of the pixel control device, as shown in FIG. 32(*a*). (Incidentally, longitudinal data lines 109 can be held straight.) That is to say, the wiring patterns D9, P7 and G8 intended for connection with the wirings including the gate lines 108, data lines 109 and pixel lines 17 are formed in advance in the pixel control device. On the other hand, as the screen mask MM a metal mask and a mesh mask can be cited. Though either will do, the metal mask is preferred for the reason that will be described later. One example of the screen mask MM using the metal mask is shown in FIG. 32(*b*), in which the screen mask of metal foil is formed with a prescribed broken-line patterns (longitudinally and laterally slit patterns) that comprise slit patterns MP7 and MG8 and MD9 so as to correspond to the pixel lines 107, gate lines 108 and data lines 109. In the screen-printing of the present embodiment, the metal mask of metal foil having a thickness of around 20 μm is used and has a pattern portion provided with slits (pattern). Coating of ink (wiring material) is performed from the slit portion. Here, reference numerical symbol MD9 denotes a pattern corresponding to the data lines 109 of the planar display substrate 100 shown in FIG. 32(*c*), MP7 a pattern corresponding to the pixel lines 107 and MG8 a pattern corresponding to the gate lines 108. At the center of the longitudinally and laterally slit patterns MD9, MP7 and MG8, the pixel control device 1 for controlling a plurality of pixels is to be disposed. In order for the pixel control devices 1 to control the entire picture including the gate lines 108 and data lines 109, a structure in which part of the wirings formed in the entire display screen pass through the interiors of the pixel control devices 1 disposed on the entire display screen for controlling the plurality of pixels is preferably adopted. The adoption of this structure, when pattern-wiring the wirings, such as the data lines 109 and gate lines 108, using the screen mask MM, enables the slit patterns MD9, MP7 and MG8 to be divided every one micro-region like the longitudinally and horizontally prescribed pattern of the screen mask MM. Use of the screen mask MM having these slits formed therein enables wirings, such as the gate lines 108, to be formed on the planar display substrate 100 at a time. The wirings in the conventional liquid crystal display comprise longitudinally extending wirings, laterally extending wirings and a TFT between a longitudinally extending wiring and a laterally extending wiring, and signal lines (data lines and gate lines) for sending signals to the individual pixels are connected to each other substantially in straight lines in the longitudinal and lateral directions. For this reason, it has not been possible to process a metal mask per se. In addition, the conventional wiring method comprises the steps of depositing a thin film of wiring material on the whole surface of a substrate, performing a pattern transfer using photolithography, etching the thin film of wiring material, removing a resist film and other such expensive and complicated manufacturing steps. In the present embodiment, however, since the wirings on the substrate form broken-line pattern (discontinuous pattern) owing to the interposition of the pixel control device 1, all the wirings can be formed using the method mentioned above. It is to be noted that the principal portions (straight-line portion) of the wirings, such as gate lines 108, extending longitudinally and laterally may first be formed in accordance with the conventional wiring formation method and then only the connection portions with the pixel control devices 1 as their centers may be formed in accordance with the wiring formation method of the present embodiment.

In the present embodiment, since the pixel control device 1 is disposed at the center where the gate lines 108 and data lines 109 are broken, the wiring material can directly printed and coated on the planar display substrate 100 in a lump through screen printing using the metal mask MM. Thus, the wiring patterns can be formed on the substrate with a high efficiency and the production efficiency is remarkably enhanced. Why the metal mask is used is that the method using a screen mesh has restrictions on printing of 10 to 20 μm-wide micro-lines and is at present difficult to use because LCD signal lines are generally around 10 μm in width. To the contrary, in the screen-printing using the metal mask MM, micro-lines having a width of 10 μm or less can directly be printed, and the cost incurred for this wire formation is less than that incurred for the prior art.

In the subsequent step R7, orientation films 110 are formed on the surface of the planar display substrate 100 as shown in FIG. 24 and then subjected to rubbing. In the subsequent step R8, the color filter substrate 111 is attached and, in subsequent step R0, liquid crystal 112 and spacers are introduced and sealed to complete the liquid crystal display 200.

METHOD OF PRODUCING A PLANAR DISPLAY SUBSTRATE ACCORDING TO THE SECOND EMBODIMENT

In the present embodiment, a transfer step R11 to the substrate 9 for pickup is performed as shown in the flow chart of FIG. 25 after the cutting step R10 for pixel control devices 1. After the mechanical polishing of the silicon substrate 2 shown in FIG. 6 at step R2, positional alignment of the integrated circuits 3 formed on the silicon substrate 2 and patterning of the pixel control devices 1 are conducted so that cutting can be established at step 10 between the integrated circuits 3. At this time, since the integrated circuits 3 exist not on the side of the front surface of the silicon substrate 1, but on the side in contact with the support substrate 7, the positional alignment cannot be conducted while discernibly confirming the positions thereof directly from above. Therefore, the positional alignment can be conducted through provision of position-aligning marks on the back surface 2*b* of the silicon substrate 2 or formation of through holes for positional alignment in the silicon substrate 2 and the support substrate 7 for enabling the positional alignment. When the support substrate 7 and adhesive tape 8 are made transparent, however, the positions of the integrated circuits can be confirmed from the back surface side.

Figure 26:
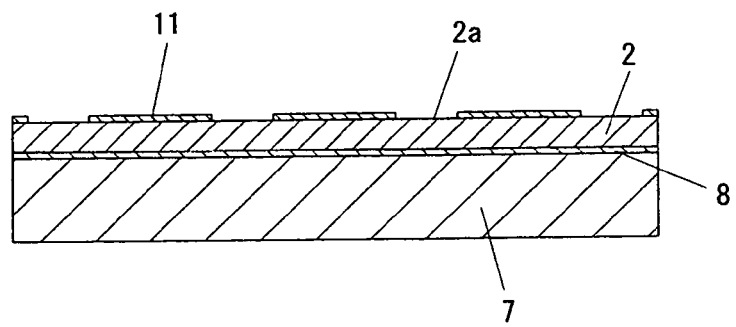
FIG. 26 is a cross section showing the silicon substrate that has been subjected to patterning.
Figure 27:
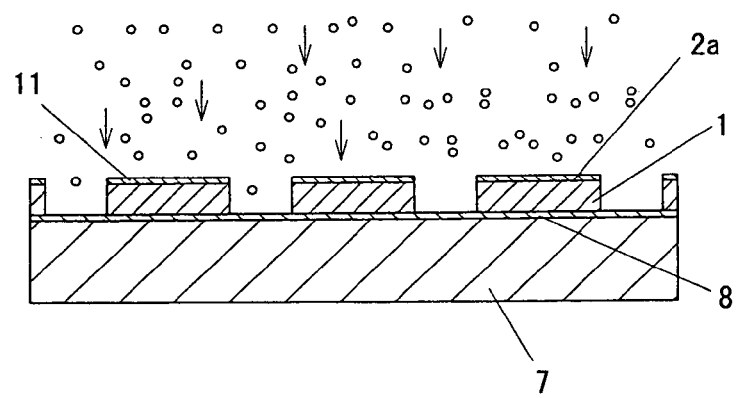
FIG. 27 is an explanatory view showing sand blast processing.
Figure 28:
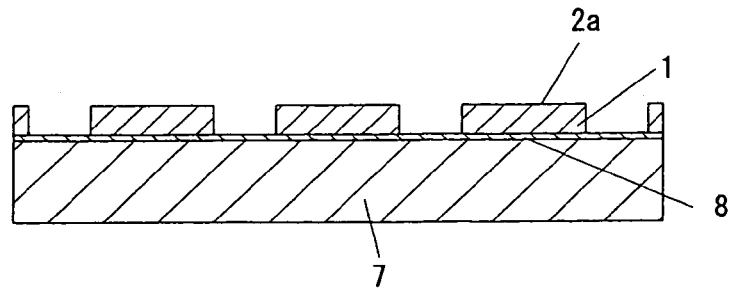
FIG. 28 is a cross section showing the silicon substrate from which the photoresists have been removed.

The patterning is conducted by means of the photolithography. The state having undergone the patterning is shown in FIG. 26. Subsequently, sand blasting is carried out, as shown in FIG. 27, with the photoresists 11 formed in consequence of the patterning used as masks. After the separation of the individual pixel control devices 1, the photoresists 11 are exfoliated. FIG. 28 shows the state having exfoliated the photoresists 11.

Figure 29:
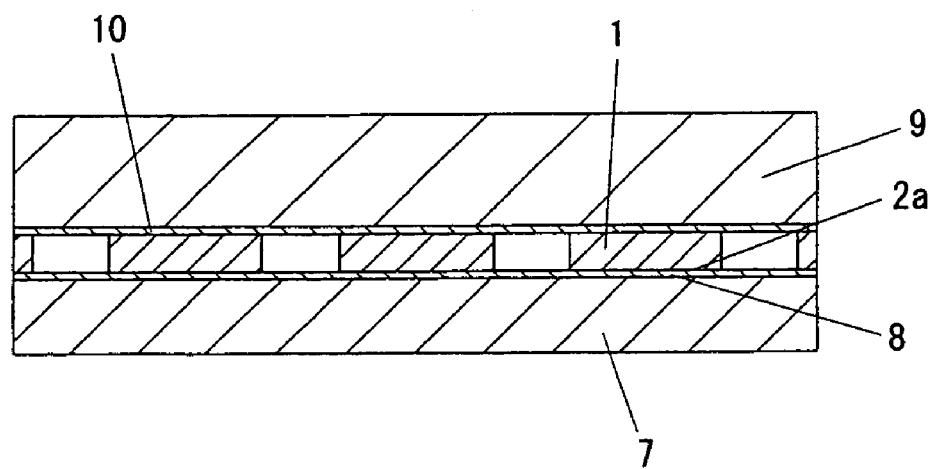
FIG. 29 is a cross section showing the state before the silicon substrate is intended to be upside down.
Figure 30:
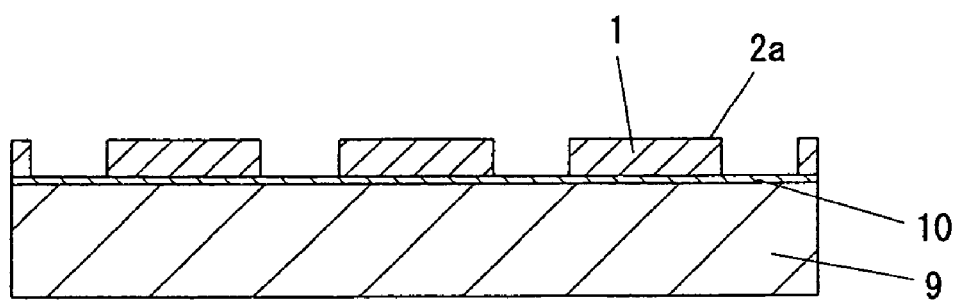
FIG. 30 is a cross section showing the state in which the silicon substrate has been upside down.

At step R11, a second adhesive tape 10 is used to attach the back surface of the pixel control device 1 and the substrate 9 for pickup to each other as shown in FIG. 29. The first adhesive tape 8 is heated via the support substrate 7 to exfoliate the first adhesive tape 8 and support substrate 7. Here, during the course of heating the first adhesive tape, since the adhesive force thereof is lowered, there is a possibility of the pixel control devices 1 being scattered or deviated in position in the exfoliation by heating. In order to avoid this, it is necessary to take into consideration heating of the first adhesive tape 8 while fixing the pixel control devices 1 with a slight pressing force. In this way, the pixel control devices 1 are transferred from the support substrate 7 onto the pickup substrate 9. As shown in FIG. 30, at this time, the surface on which the integrated circuits 3 have been formed serves as a front surface.

Here, it is desirable from the standpoint of the positional deviation prevention that the adhesive tapes 8 and 10 be selected so that the thermal exfoliation temperature of the first adhesive tape 8 may be lower than that of the second adhesive tape 10 in the same manner as in the first embodiment. Alternatively, the adhesive forces of the adhesive tapes 8 and 10 may be made different. In case where an adhesive tape having an adhesive force large enough to resist the force exerted onto the pixel control devices 1 and silicon substrate 2 at the steps of the mechanical polishing of the silicon substrate and separation of the pixel control devices 1 by cutting is selected as the first adhesive tape 8 and where an adhesive tape having an adhesive force facilitating the pickup step is selected as the second adhesive tape 10, the positional deviation can infallibly be prevented and the subsequent pickup step is taken smooth. In the same manner as in the first embodiment, the adhesive force of only portions of the adhesive tape in the vicinity of the pixel control devices 1 may be made weak.

EXAMPLE

Manufacture of a liquid crystal display having a diagonal dimension of 50 inches, a screen resolution of SXGA (1280×3 colors ×1024) and an aperture ratio of 80% will next be described while comparing with that in accordance with Patent Document 1.

(1) Comparison in Shape of the Device:

When controlling 12 pixels with one device in accordance with the present invention, the size of an Si chip will be around 200 μm. On the other hand, when one pixel is being controlled with one device in accordance with Patent Document, the size of an Si chip will be around 60 μm.

(2) Comparison in Device Pitch:

The device pitch in the present invention will be around 1.7 mm in the lateral direction and around 1.22 mm in the longitudinal direction, whereas in Patent Document it is around 0.3 mm in the lateral direction and around 0.6 mm in the longitudinal direction.

The present invention and Patent Document 1 are compared, with the premises mentioned above made. (1) The pixel control devices for controlling a plurality of pixels in the present invention is far larger than those of Patent Document with respect to "productivity at the device processing," the cutting stock can be made smaller in the present invention to enable the amount of the material consumed to be reduced, and the number of processing man-hours can be much smaller in the present invention. (2) In terms of transfer of devices onto a substrate, since the present invention uses a vacuum chuck having vacuum holes formed therein at the same pitches as the pixel control devices to selectively pick up the pixel control devices regularly arrayed and transfer the picked-up devices onto the planar display substrate, the vacuum holes have a diameter of around 100 μm and are arranged at a lateral pitch of 1.7 mm and a longitudinal pitch of 1.2 mm. When the Si chip substrate from which the devices are to be transferred is an eight-inch wafer, around 9,000 Si chips can be picked up at a time. On the other hand, Patent Document 1 requires vacuum holes to be formed to have a diameter of 40 μm at a pitch of 0.3 mm. When picking up Si chips from an eight-inch wafer substrate, in this case, about 110,000 vacuum holes are to be formed. The processing techniques available to date for forming deep holes for a vacuum chuck enable formation of holes 100 μm in diameter, but are difficult to form micro-holes 40 μm or less in diameter. Furthermore, since Patent Document 1 necessitates formation of an extremely great number of such holes, the method thereof will actually not be practically realized. (3) The "examination and repair of the devices" according to the present invention are easier because the number of devices to be arrayed is smaller. When adopting "pickup and burying steps" in the method of Patent Document 1, since one device can only control one pixel, a vacuum chuck per se for use in the pickup is difficult to process as described above. When the size of the device per se is made larger, the aperture ratio is lowered to deteriorate the performance of a liquid crystal display.

While the first and second embodiments concern the application of the present invention to a liquid crystal display, as described above, the present invention is not restricted thereto and can widely be applied to the manufacture of planar displays using organic EL and the like.

(Mounting apparatus for pixel control devices)

An apparatus for mounting the pixel control devices using the methods described in the first and second embodiments will now be described.

Figure 31:
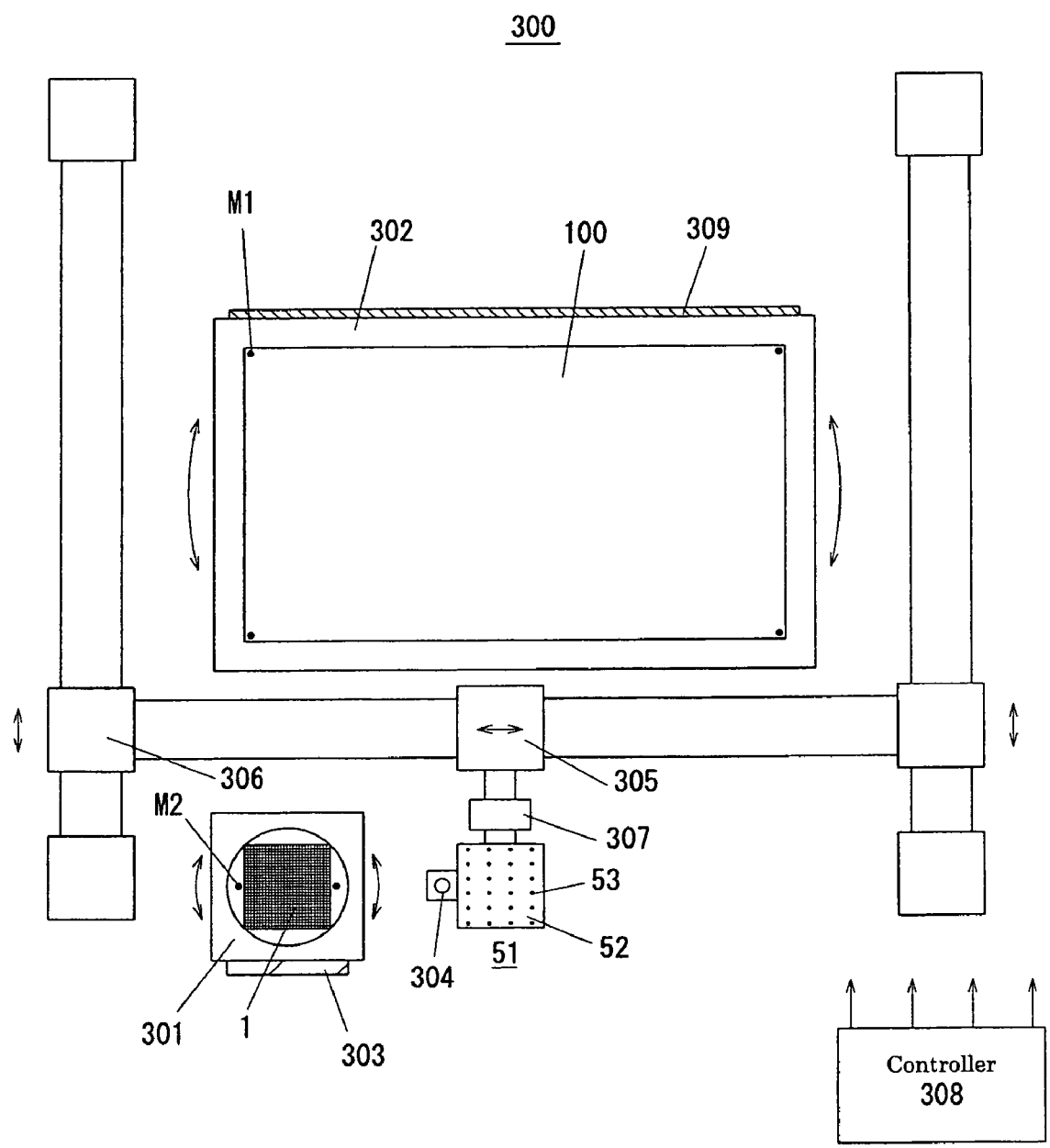
FIG. 31 is a schematic view showing a pixel control mounting apparatus.

Shown in FIG. 31 is a mounting apparatus 300 for pixel control devices 1 according to the embodiment of the present invention. This mounting apparatus 300 has a picking-up function and an arraying function manifested when selectively transferring pixel control devices 1 onto the planar display substrate 100 and is for performing step R5 shown in FIG. 25. The arraying function is established with a pixel control device stage 301 for retaining the pixel control devices 1 and a substrate stage 302 for retaining the planar display substrate 100. The pixel control device stage 301 retains the pixel control devices 1 using an electrostatic chuck and an adhesive tape of low adhesive force and is equipped with an exfoliation mechanism 303 comprising means, such as a heater or an ultraviolet irradiator. The substrate stage 302 is for retaining the planar display substrate 100 by means of a vacuum chuck, an electrostatic chuck, a mechanical chuck or other such chuck and is equipped with a heating mechanism 309, such as a heater. When using a mechanical chuck, the end portions of the planar display substrate 100 are to be retained. Each of the pixel control device stage 301 and the substrate stage 302 is equipped with a rotation angle adjustment mechanism that comprises a controller 308 able to regulation-control the rotation angle using a computer etc. The picking-up function is established with a pickup apparatus 51 that selectively chuck pixel control devices 1 and a camera 304 for positional alignment, an X-axis regulating mechanism 305, a Y-axis regulating mechanism 306 and a Z-axis regulating mechanism 307 that are accompanied with the pickup apparatus 51. The axis-regulating mechanisms 305, 306 and 307 are for position-aligning the pickup apparatus 51 to an optimum position with respect to the individual axes and are controlled for positional alignment with the controller 308. The data on images taken with the position alignment camera 304 are sent to the controller 308 and displayed on a monitor (not shown) of the controller 308.

Actual mounting of the pixel control devices 1 using the mounting apparatus 300 will be described herein below. The substrate 9 for pickup having the pixel control devices retained thereon is placed on the pixel control device stage 301, and the planar display substrate 100 is placed on the substrate stage 302. The two substrates are then subjected to parallel adjustment. This parallel adjustment is for adjusting the rotation angle adjustment mechanisms for respective stages 301 and 302 so that the first direction X in the pickup substrate 9, the first direction X in the planar display substrate 100 and the direction in which the X-axis regulating mechanism 305 is movable may be in parallel to one another. The parallel adjustment can be done so that the second directions Y and Y in the respective substrates 9 and 100 may be in parallel to the direction in which the Y-axis regulating mechanism 306 is movable. The degree of parallelism can be readily confirmed through positional alignment marks M1 provided in advance as standards on the silicon substrate 2 or substrate 9 for pickup having the pixel control devices 1 formed thereon and on the planar display substrate 100. Alternatively, the end portions of the pixel control device 1 and planar display substrate 100 may be used as standards. The degree of parallelism is confirmed by confirming positional alignment marks M2 of the silicon substrate 2 or pickup substrate 9 or the end portions of the pixel control devices 1 and planar display substrate while using the camera 304 for positional alignment to confirm the monitor of the controller 304 and rotating the image control device stage 301 so that the first direction X of the pickup substrate 9 may be in parallel to the direction in which the X-axis regulating mechanism 305 is movable. Similarly, the substrate stage 302 is rotated so that the first direction X of the planar display substrate 100 may be in parallel to the direction in which the X-axis regulating mechanism 305 is movable. In this case, the controller 308 may be used to image-process signals from the camera1 304 for positional alignment, thereby enabling automatic parallel adjustment.

After this parallel adjustment, the position data of the positional alignment marks M2 of the silicon substrate 2 or pickup substrate 9 and of the positional marks M1 of the planar display substrate 100 are stored in the controller 308. The position data comprise those of the X-axis, Y-axis and Z-axis regulating mechanisms 305, 306 and 307. In place of the positional alignment marks M1 and M2, for example, the position of the lowermost chip on the left side of the pixel control devices 1 (a standard chip) and the position of the lowermost end of the planar display substrate 100 on the left side thereof may be used as standard positions and stored in the controller 308 as position data.

After completion of the storage of the position data, the pixel control devices are picked up. Before this pickup, the heater of the exfoliation mechanism 303 or the ultraviolet irradiator is driven in advance to cause the second adhesive tape 10 on the substrate 9 for pickup to be in a state low in its adhesive force. Also the heater of the heating mechanism 309 is driven in advance to cause the transparent thermoplastic resin film 101 on the planar display substrate 100 to be plastically deformable. As described in the first embodiment, the pickup device 51 is equipped with the vacuum chuck 52 in which the chuckholes 53 are formed at pitches 55 and 56 that are the same respectively as pitches 105 and 106 of the pixel control devices 1 on the planar display substrate 100. The position data of the chuckholes 53 are stored in advance in the controller 308. The controller 308 is then used to drive the X-axis, Y-axis and Z-axis regulating mechanisms 305, 306 and 307 and move the vacuum chuck 52 to a position above the pixel control device stage 301, thereby initiating the pickup of the pixel control devices 1. When a pixel control device 1 to be picked up first is regarded as a pixel control device 1 disposed at a position closest to the aforementioned standard position, the subsequent control can efficiently be performed, which is preferable.

As also described in the first embodiment, the energy line, such as ultraviolet beams, can be used to lower the adhesive force of the second adhesive tape 10 depending on the kinds of the second adhesive tape 10 and substrate 9 for pickup. In this case, an energy line-generating device for generating heat rays or ultraviolet beams is used as the exfoliation mechanism 303 and brought to a standby state preparatory to the pickup step. When initiating the pickup step (or immediately before the initiation), the energy line is irradiated only onto the neighborhood of a pixel control device 1 to be picked up to locally lower the adhesive force of the second adhesive tape 10. Thus, since it is unnecessary to maintain the heated state (or the state irradiated with ultraviolet beams) from the beginning to the terminal of the pickup step and since the portion of the second adhesive tape 10 in the vicinity of the pixel control devices 1 not to be picked up is not brought to the state low in its adhesive force, there is no possibility of the array of the pixel control devices 1 on the pickup substrate 9 being disturbed.

The X-axis, Y-axis and Z-axis regulating mechanisms 305, 306 and 307 are driven to transfer the vacuum chuck 52 having picked up the pixel control devices 1 to a position above the planar display substrate 100 and mount the pixel control devices 1 on the planar display substrate 100. The pickup and mounting of the pixel control devices 1 are repeated to mount the pixel control devices 1 on the entire surface of the planar display substrate 100. Furthermore, a plurality of pixel control device stages 301 and pickup devices 51 are used to perform parallel mounting of several lots of pixel control devices 1, which can manifest enhancement of the productivity.

Since the transparent thermoplastic resin film 101 has been plastically deformable by means of the heating mechanism 309, when the pixel control devices 1 are mounted, with the vacuum chuck 52 pressed against the transparent thermoplastic resin film 101, they are arrayed as buried in the transparent thermoplastic resin film 101. In case where the film is not heated in advance by means of the heating mechanism 309 or where no heating mechanism 309 is provided on the substrate stage 302, the pixel control devices 1 located above the planar display substrate 100 (transparent thermoplastic resin film 101) may be subjected to hot press from above, thereby mounting the devices as buried in the transparent thermoplastic film resin 101. Otherwise, laser beams may be used to locally irradiate the transparent thermoplastic resin film 101 from the back surface side.

When the transparent ultraviolet curing resin film 104 is used after mounting of the pixel control devices 1, after it is applied onto the surface of the planar display substrate 100 on which the pixel control devices 1 have been arrayed, a separate ultraviolet irradiator (not shown) is used to irradiate the planar display substrate 100 from the back surface thereof, thereby fixing the pixel control devices 1 in position. In this case, the separate ultraviolet irradiator may be incorporated into the substrate stage 302.

While the mounting apparatus 300 used herein is for picking up the pixel control devices 1 on the pickup substrate 9 and mounting the picked-up devices on the planar display substrate 100, the steps other than the pickup and mounting step R5 in each of the first and second embodiments can be carried out using the widely known manufacturing apparatus (semiconductor manufacturing apparatus or photolithography apparatus, for example). In other words, when apparatus pertaining to mounting of the pixel control devices have already been introduced, new introduction of the mounting apparatus 300 alone enables the mounting method for pixel control devices described in the first and second embodiments to be performed.

EXAMPLE

An actual example will be described, in which the mounting apparatus 300 is used to selectively transfer pixel control devices 1 onto a planar display substrate 100 for a liquid crystal display. The liquid crystal display has a diagonal dimension of 50 inches and a screen resolution of SXGA. When producing pixel control devices 1 having a longitudinal size of 200 μm, a lateral size of 150 μm and a thickness of 0.06 mm at a pitch 5 of 0.215 mm in the first direction X and a pitch 6 of 0.244 mm in the second direction Y on a 8-inch silicon substrate 2 (200 mm in diameter), 370,000 pixel control devices 1 per silicon substrate (having a device formation portion of 140 mm×140 mm) can be produced. When a liquid crystal display 200 having a diagonal dimension of 50 inches (1107 mm×623 mm) and a screen resolution of SXGA (1280×1024×3 colors) is to be produced, one pixel (3 colors) measures 0.86 mm×0.61 mm. That is to say, the pitch 105 of the pixel control devices 1 on the planar display substrate 100 in the first direction X becomes 1.72 mm, and the pitch 106 thereof in the second direction Y becomes 1.22 mm. The number of pixel control devices 1 necessary in this case is about 330,000. Specifically, from a single silicon substrate 2, pixel control devices 1, the number of which corresponds to a single planar display substrate 100 used for the 50-inch liquid crystal display 200 can be produced.

As a vacuum chuck for picking up the pixel control devices 1, used was the one 52 having formed therein chuckholes 53 that are 100 μm in diameter, in which 80 (=K) rows of chuckholes in the first direction X and 102 (=L) columns of chuckholes in the second direction Y were formed so that the pitch 55 thereof in the first direction X might be 1.72 mm and the pitch 56 thereof in the second direction Y might be 1.22 mm.

The vacuum chuck 52 was used to pick up K×L (=80× 102=8160) pixel control devices 1 from the pixel control devices and transfer these onto the planar display substrate 100 at the pitch 105 in the first direction X (=1.72 mm) and pitch 106 in the second direction Y (=1.22 mm). This was repeated to transfer the pixel control devices 1 onto the entire surface of the planar display substrate 100. As a result, the pixel control devices 1 could be transferred onto the entire surface of the planar display substrate 100 through selective transfer of 40 times in total, i.e. 8 times in the first direction X and 5 times in the second direction Y.

(Comparison Between the Example and Patent Document 2)

Figure 8:
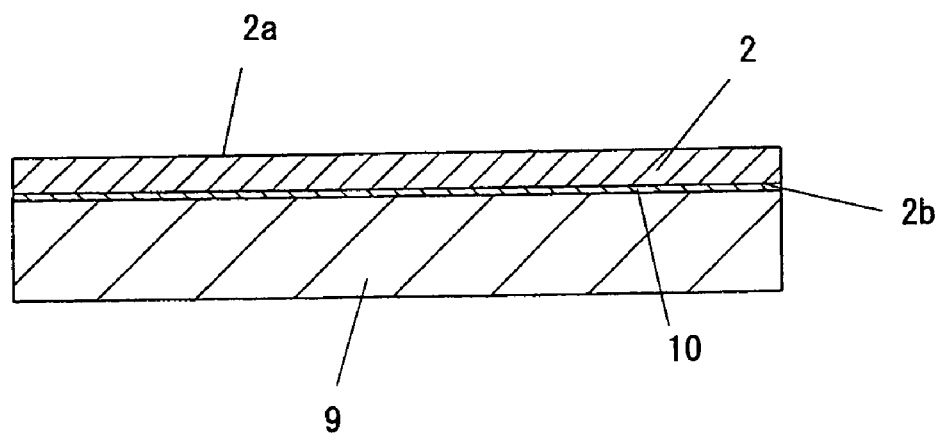
FIG. 8 is a cross section showing the state in which the silicon substrate has been upside down.

In the invention of Patent Document 2, "device blocks 13" corresponding to the pixel control devices of the present invention are picked up and transferred one by one, whereas in the present invention a plurality of pixel control devices are picked up and transferred at the predetermined pitches. To be specific, Patent Document 2 describes (in paragraph No. 0018) that "a device block 13 is exfoliated as a unit from a device formation substrate 11" and that "the interval between the adjacent device blocks after being transferred is made large" (in paragraph No. 0023). In addition, grip means (pickup device of the present invention) used in Patent Document 2 is illustrated in paragraph No. 0030 and in FIG. 8.

While it is also described that the grip means is provided with a hollow portion 35 and a gas-venting hole 34 (chuckholes of the present invention) for chucking a device block 13 (pixel control device of the present invention), the number of each of the hollow portion 35 and gas-venting hole is one, and the number of the device block 13 capable of being chucked with the grip means (pickup device) is one. That is to say, in Patent Document 2, the grip means (pickup device) capable of chucking and gripping a single device block 13 is used to pick up the device blocks 13 one by one and transfer the picked-up device blocks onto a display substrate 14 (planar display substrate) one by one (FIG. 36($a$)). For this reason, the pickup and transfer step has to be taken every one device-block (pixel control device of the present invention), i.e. the same times as the number of the device blocks, and furthermore, the device block has to be subjected to positional alignment on the display substrate 14 every one pickup-and-transfer step.

In contrast, according to the first aspect of the present invention "a plurality of pixel control devices are formed on the substrate for pixel control devices so that the array pitch may be px/m obtained by dividing the array pitch px of the pixel control devices in the first direction on the planar display substrate by a natural number m and the array pitch may be py/n obtained by dividing the array pitch py of the pixel control devices in the second direction on the planar display substrate, which direction is orthogonal to the first direction, by a natural number n, that the pickup device is formed therein with chuckholes for chucking the pixel control devices at the array pitch px in a direction corresponding to the first direction and at the array pitch py in a direction corresponding to the second direction, and that only the pixel control devices corresponding to the array pitches px and py on the planar display substrate are selectively chucked and retained with the pickup device and then transferred onto the planar display substrate". Thus, since the array pitches (px/m and py/n) of the pixel control devices on the substrate for pixel control devices and the array pitches (px and py) of the chuckholes of the pickup device are related to the array pitches (px and py) on the planar display substrate, a single operation of pickup enables a plurality of pixel control devices to be selected at the array pitches (px and py) on the planar display substrate and, with the array pitches maintained, to be transferred onto planar display substrate (FIG. 36($b$)). That is to say, since the pixel control devices are selected every natural number m (at "m−1" intervals) in the first direction X and every natural number n (at "−1" intervals) in the second direction Y, the pixel control devices 1 shown by the oblique lines in FIG. 13 are selectively picked up. Therefore, the present invention can reduce the number of the pickup-and-transfer step and enhance the production efficiency as compared with Patent Document requiring the pickup-and-transfer step to be taken every one device-block 13 (pixel control device of the present invention)

Furthermore, unlike in Patent Document 2 requiring the positional alignment to be made every one device-block 13 (pixel control device of the present invention) on the display substrate 14 (planar display substrate of the present invention), since the pixel control devices of the present invention have already been disposed at the array pitches (px and py) on the planar display substrate at the time the pixel control devices are picked up, the positional alignment of the plurality of pixel control devices can be attained at a time. This effect has been explicated in the description that "therefore, the vacuum chuck 52 enables the pixel control devices 1 satisfying the pitch 105 in the first direction X and the pitch 106 in the second direction Y on the planar display substrate 100 to be picked up at a time by the maximum number of "K×L" and the picked-up "K×L" number of pixel control devices to be transferred at a time onto the planar display substrate 100" and in the description that "when performing the second pickup, the vacuum chuck 52 is positioned as shifted by the pitch px/m, for example, in the first direction X (in the right-hand direction in FIG. 13) on the pickup substrate 9 and, as a result, the pixel control devices 1 each adjoining on the right side of the pixel control devices 1 already picked up (those shown by oblique lines in FIG. 13) can selectively picked up in the same manner as in the first pickup." Thus, one of the characteristic features of the present invention is that the precise pickup step can be attained while carrying out the positional alignment.

In this point, Patent Document 2 describes in paragraph 0017 that "the interval of the thin film transistor devices 12 may be a distance that can attain separation of the devices" and does not take into consideration any pitch of arraying the thin film transistor devices on the substrate 11 for formation of pixels (substrate for pixel control devices in the present invention). It is understood from this point that the prior art does not take into consideration at all the array pitch for device blocks 13 (pixel control devices) that are aggregates of the thin film transistor devices.

Figure 36A:
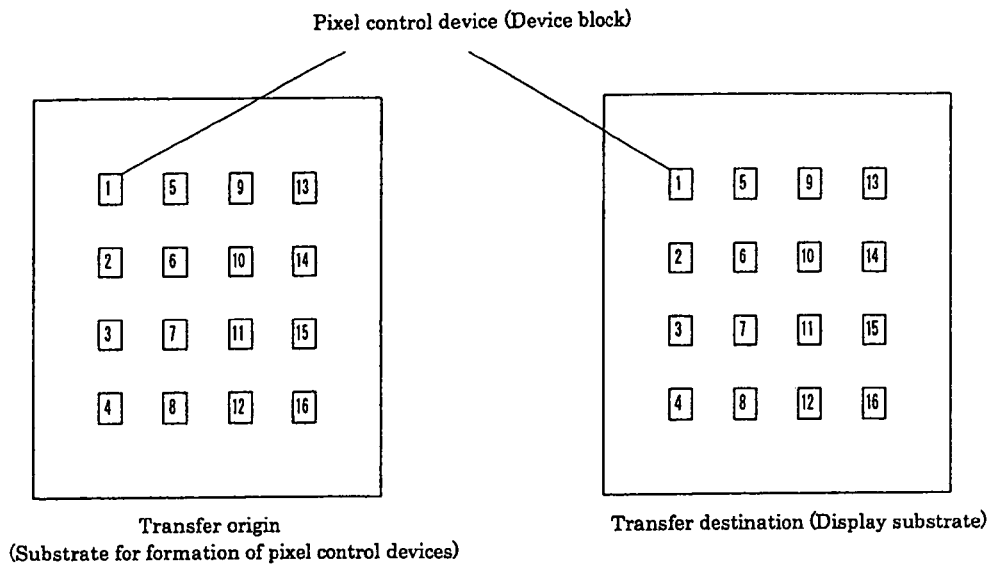
FIG. 36 is an explanatory view showing the comparison between the contents of Patent Document 2 and those of the present invention.
Figure 36B:
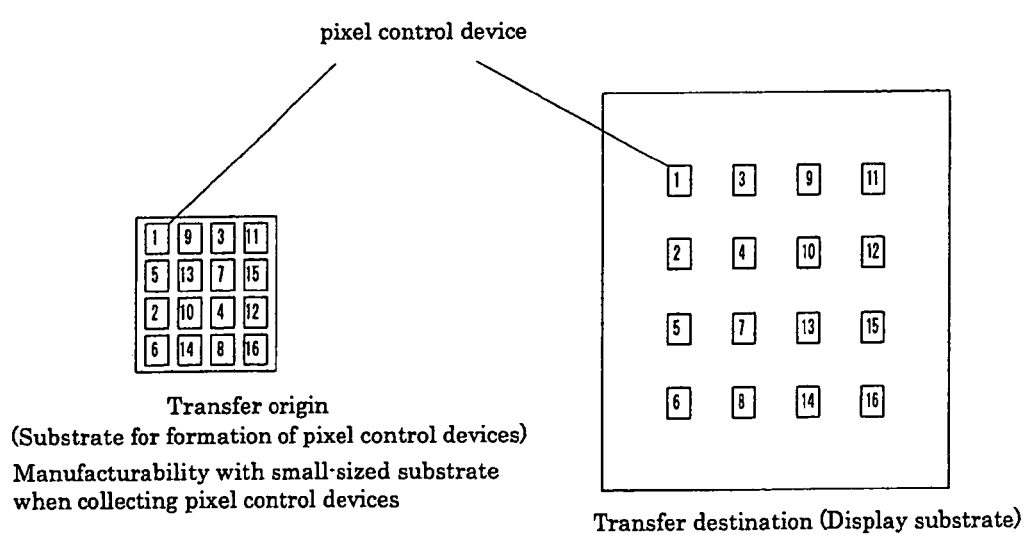

In Patent Document 2, therefore, it is conceivable that as shown in FIG. 36(a) the array pitches of the device block 13 (pixel control devices) on the transfer origin (substrate for pixel control devices) and on the transfer destination (planar display substrate) correspond to each other so that they may be the same as each other. In such a given correspondence, the device blocks 13 (pixel control devices) are formed on the substrate for pixel control devices in a spread state and, as a result, the production number of the pixel control devices per area of the substrate for pixel control devices becomes very small.

In contrast, according to the present invention, it is described that "a plurality of pixel control devices are formed on the substrate for pixel control devices so that the array pitch may be px/m obtained by dividing the array pitch px of the pixel control devices in the first direction on the planar display substrate by a natural number m and the array pitch may be py/n obtained by dividing the array pitch py of the pixel control devices in the second direction on the planar display substrate, which direction is orthogonal to the first direction, by a natural number n. Thus, since the pixel control devices are formed on the substrate for pixel control devices at the array pitches (px/m and py/n) obtained by dividing the array pitches (px and py) on the planar display substrate by natural numbers (m and n), the pixel control devices can be formed on the substrate for pixel control devices in a dense state while giving the correspondence between the substrate for pixel control devices and the planar display substrate (FIG. 3 of Patent Document 2). With this, the production efficiency of the pixel control device per area of the substrate for pixel control devices becomes significantly high in comparison with the merely given correspondence in the prior art.

As described above, it is conceivable that the "device block 13" is an aggregation of four thin film transistor devices 12 controlling four pixels disposed around the aggregation, respectively. To be specific, the four pixels are disposed in two rows and two columns and the four thin film transistor devices 12 are disposed in a dense state at the center of the four pixels. This disposition is also adopted in Patent Document 2 (refer to FIG. 5 thereof). That is to say, while the device block 13 of Patent Document 2 (corresponding to the pixel control device of the present invention) is an aggregation of a plurality of thin film transistor devices 12 each controlling one pixel, whereby a plurality of pixels are controlled with a plurality of thin film transistor devices, the pixel control device of the present invention control a plurality of pixels with a single integrated circuit. The two differs in this respect from each other. In the case of applying "the pixel control device that controls a plurality of pixels with a single integrated circuit" in the first aspect to the liquid crystal display according to one embodiment of the present invention, on the planar display substrate 100 facing the color filter substrate 111 with the liquid crystal 112 intervening between the two, a plurality of pixel control devices each controlling a plurality of pixels (3 colors ×4 pixels, for example) with a single integrated circuit are disposed together with the wirings for the pixel control devices. Generally, the wiring portions in the display function as light-blocking portions. When intending to control a plurality of pixels with a single device corresponding to each of the pixels as in Patent Document 2, the wiring portions converge on the device and form light-blocking portions. On the other hand, in the present invention, the pixel control device and wiring for it enables saving of wiring and enhancement of the aperture ratio.

INDUSTRIAL APPLICABILITY

According to the method of the present invention for selectively transferring pixel control devices, the pixel control devices can be formed at pitches obtained by dividing the array pitches in the first and second directions on the planar display substrate by natural numbers, respectively, and since only the pixel control devices corresponding to the array pitches on the planar display substrate are selectively transferred from the formed pixel control devices, all the pixel control devices can easily be transferred without any loss. When performing the step of cutting into the pixel control devices after transferring them onto the substrate for pickup so that the surfaces of the integrated circuits are directed to the front surface, since the positional alignment can be performed while confirming the surfaces of the integrated circuits, the step of cutting is made easy. When transferring the pixel control devices to the substrate for pickup so that the surfaces of the integrated circuits are directed to the front surface after the step of cutting into the pixel control devices, the surfaces of the integrated circuits can infallibly be protected during the step of mechanical polishing and cutting and, at the same time, the adhesive force can be set appropriate in accordance with the purpose such that the adhesive force on the support substrate is made strong enough to endure the steps of mechanical polishing and cutting and that the adhesive force on the substrate for pickup is at a degree ready to transfer the pixel control devices. By so doing, the reliability at each of the steps can be made high. Varying the respective adhesive means enables the array of the pixel control devices to be prevented from being disturbed when transferring the pixel control devices from the support substrate to the substrate for pickup.

In addition, by fixing the pixel control devices on the planar display substrate, the surface of which is coated with a plastically deformable, transparent, thermoplastic resin film, it is possible to infallibly prevent positional displacement of the pixel control devices with ease during and after the mounting thereof. In this case, by applying a fluorine resin to the surface of the pickup device on which the pixel control devices are chucked, there is no possibility of the transparent thermoplastic resin film being attached to the surface of the pickup device. Where the arrayed pixel control devices are pressed to retain them on the transparent thermoplastic resin film, the pickup device is used to blow compressed air toward the resin film. As a result, the pixel control devices are tightly adhered to the transparent thermoplastic resin film. Thus, it is possible to infallibly separate the pixel control devices from the pickup device and prevent positional displacement of the pixel control devices on the transparent thermoplastic resin film.

Also by coating the side portion of the pixel control device, other than the upper surface thereof that is an integrated circuit formation portion, with a transparent ultraviolet curing resin film, the pixel control device can infallibly be fixed in position and, at the same time, wirings drawn out from the upper surface of the pixel control device can stably be formed.

The mounting apparatus used in the selection transfer method for the pixel control devices according to the present invention is adapted mainly to pick up the pixel control devices and mount the picked-up devices on the planar display substrate. In the selection transfer method for the pixel control devices according to the present invention, since the steps other than the pickup and mounting step can be carried out using the widely known manufacturing apparatus, new introduction of the mounting apparatus alone enables the selection transfer method for pixel control devices according to the present invention to be performed with ease. Also since the existing equipment can be utilized for the other steps, the entire process can inexpensively be carried out.

The wiring formation method after the transfer of the pixel control devices of the present invention forms wirings by means of the screen printing using a screen mask having a predetermined pattern formed thereon while forming wirings on a pixel control device that controls a plurality of pixels so as to pass through the interior thereof. Therefore, the efficiency of the conventional wiring formation work that has been able to only form a complicated and expensive thin film can significantly be enhanced to enable the wirings to be formed inexpensively.

According to the present invention, since a plurality of pixel control devices each controlling a plurality of pixels with a single integrated circuit are formed on the planar display substrate as well as their wirings, it is possible to realize reduction of the number of the wirings, resulting in contribution to the enhancement of the aperture ratio. To be specific, since each pixel control device can control a plurality of pixels with a single integrated circuit, is disposed at substantially the center of the array of pixels having "i" columns and "j" rows and is connected with each pixel via the wiring, it is possible to realize reduction of the number of the wirings (wiring number reduction capability) and reduce the area of light-blocking portions resulting from the wiring formation.

In Patent Document 2, since the device is disposed at a pitch of two pixels, the light-blocking portion constituted by the wiring is formed at the two-pixel pitch. In this case, since colors are separate every two colors, such as RG, BR, GB or RG, the color phenomena are problematic. In contrast, when the product "i×j" in the array of pixels having "i" columns and "j" rows is a multiple of 3 and when the pixel control device controls a plurality of pixel groups with a single integrated circuit, with 3 pixels of three different colors regarded as a pixel group, as in the present invention, since colors are separate every three colors of RGB, color phenomena intrinsically required can be generated. Also since a color mixture with the color of the adjacent pixel can be prevented, the enhancement of a color contrast can be expected. Furthermore, when 12 pixels of 3 colors×4 pixels in the pixel array of 2 columns and 6 rows are to be controlled, since the pixel control devices are arrayed at a 6-pixel pitch and colors can be separate every three colors of RGB while maintaining the effect of enhancing the aperture ratio, color phenomena intrinsically required can be generated. Moreover, since separation of three colors of RGB can prevent a color mixture with the color of the adjacent pixel, the enhancement of a color contrast can be expected.

The invention claimed is:

1. A method for selectively transferring onto a planar display substrate pixel control devices each controlling a plurality of pixels, comprising the steps of:

fixing a device substrate having pixel control devices for controlling the plurality of pixels onto a support substrate, each of said pixel control devices having an integrated circuit on a surface thereof;

cutting the device substrate into individual pixel control devices with the integrated circuit;

fixing the pixel control devices on the support substrate onto a pickup substrate;

holding the pixel control devices on the pickup substrate by a pickup device and transferring the pixel control devices on the pickup device onto the planar display substrate; and forming the pixels on a surface of the planar display substrate;

wherein a plurality of pixel control devices is formed on the device substrate at a first direction array pitch px/m that is obtained by dividing an array pitch px in a first direction on the planar display substrate by a natural number m and at a second direction array pitch py/n obtained by dividing an array pitch py in a second direction on the planar display substrate that is orthogonal to the first direction by a natural number n;

wherein the pixel control devices only corresponding to the array pitches px and py of the planar display substrate are selected from the pixel control devices fixed onto the pickup substrate and then transferred onto the planar display substrate; and wherein each of the pixel control devices controls 3 colors×4 pixels arrayed in 2 columns and 6 rows and is transferred to a center of the pixels arrayed in 2 columns and 6 rows.

2. A method for selectively transferring onto a planar display substrate pixel control devices each controlling a plurality of pixels with integrated circuits, comprising the steps of:

fixing a device substrate having pixel control devices for controlling the plurality of pixels onto a support substrate, each of said pixel control devices having an integrated circuit on a surface thereof;

fixing the device substrate on the support substrate onto a pickup substrate;

cutting the device substrate into individual pixel control devices with the integrated circuits;

holding the pixel control devices on the pickup substrate onto a pickup device and transferring the pixel control devices on the pickup device onto the planar display substrate; and forming the pixels on a surface of the planar display substrate;

wherein a plurality of pixel control devices is formed on the device substrate at a first direction array pitch px/m that is obtained by dividing an array pitch px in a first direction on the planar display substrate by a natural number m and at a second direction array pitch py/n obtained by dividing an array pitch py in a second direction on the planar display substrate that is orthogonal to the first direction by a natural number n, wherein the pixel control devices only corresponding to the array pitches px and py of the planar display substrate are selected from the pixel control devices fixed onto the pickup substrate and then transferred onto the planar display substrate, wherein in the step of fixing the device substrate onto the support substrate, the integrated circuits on the device substrate are directed downward toward the support substrate, and wherein in the step of fixing the device substrate, on the support substrate onto the pickup substrate, the device substrate is flipped so that the integrated circuits face upwardly on a side opposite to the pickup substrate.

3. The method for selectively transferring onto the planar display substrate the pixel control devices each controlling the plurality of pixels with the integrated circuits according to claim 1, wherein in the step of fixing the device substrate onto the support substrate, the plurality of integrated circuits is directed downward toward the support substrate, in the step of cutting the device substrate, the integrated circuit on the support substrate is cut in a condition such that the integrated circuit faces the support substrate, and in the step of holding the pixel control devices on the support substrate onto the pickup substrate, the pixel control devices are flipped so that the integrated circuits face downwardly on a side opposite to the pickup substrate.

4. A wiring formation method after transfer of the pixel control devices for controlling a plurality of pixels, comprising the steps of:

fixing a device substrate having pixel control devices for controlling the plurality of pixels onto a support substrate, each of said pixel control devices having an integrated circuit on a surface thereof;

cutting the device substrate into individual pixel control devices with the integrated circuit;

fixing the pixel control devices on the support substrate onto a pickup substrate;

holding the pixel control devices on the pickup substrate by a pickup device and transferring the pixel control devices on the pickup device onto the planar display substrate; and forming the pixels on a surface of the planar display substrate;

forming wirings inside the pixel control devices so that inside wirings pass through the pixel control devices; and forming wirings on the planar display substrate by screen printing using a screen mask having a predetermined pattern corresponding to wirings connected to the inside wirings of the pixel control devices in broken-line patterns, wherein a plurality of pixel control devices is formed on the device substrate at a first direction array pitch px/m that is obtained by dividing an array pitch px in a first direction on the planar display substrate by a natural number m and at a second direction array pitch py/n obtained by dividing an array pitch py in a second direction on the planar display substrate that is orthogonal to the first direction by a natural number n, and the pixel control devices only corresponding to the array pitches px and py of the planar display substrate are selected from the pixel control devices fixed onto the pickup substrate and then transferred onto the planar display substrate.

* * * * *